United States Patent
Kim et al.

(10) Patent No.: US 10,483,421 B2
(45) Date of Patent: Nov. 19, 2019

(54) SOLAR CELL MODULE

(71) Applicant: LG ELECTRONICS INC., Seoul (KR)

(72) Inventors: Bojoong Kim, Seoul (KR); Minpyo Kim, Seoul (KR); Daehee Jang, Seoul (KR); Hyeyoung Yang, Seoul (KR); Taeki Woo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 551 days.

(21) Appl. No.: 14/742,478

(22) Filed: Jun. 17, 2015

(65) Prior Publication Data

US 2015/0372177 A1    Dec. 24, 2015

(30) Foreign Application Priority Data

Jun. 18, 2014    (KR) .................. 10-2014-0074609
Sep. 25, 2014    (KR) .................. 10-2014-0128553

(51) Int. Cl.
| | | |
|---|---|---|
| *H01L 31/05* | (2014.01) | |
| *H01L 31/0224* | (2006.01) | |
| *H01L 31/068* | (2012.01) | |
| *H01L 31/02* | (2006.01) | |

(52) U.S. Cl.
CPC ...... *H01L 31/0516* (2013.01); *H01L 31/0201* (2013.01); *H01L 31/02021* (2013.01); *H01L 31/022441* (2013.01); *H01L 31/0682* (2013.01); *Y02E 10/52* (2013.01); *Y02E 10/547* (2013.01)

(58) Field of Classification Search
CPC .................................................. H01L 31/0516
See application file for complete search history.

(56) References Cited

U.S. PATENT DOCUMENTS

| | | |
|---|---|---|
| 2010/0018565 A1 | 1/2010 | Funakoshi |
| 2010/0139746 A1 | 6/2010 | Von Maydell et al. |
| 2011/0120530 A1 | 5/2011 | Isaka |
| 2011/0174355 A1 | 7/2011 | Biro et al. |
| 2013/0213452 A1 | 8/2013 | Ide et al. |

(Continued)

FOREIGN PATENT DOCUMENTS

| | | |
|---|---|---|
| EP | 2 869 349 A2 | 5/2015 |
| EP | 2911206 A2 | 8/2015 |

(Continued)

*Primary Examiner* — Shannon M Gardner
(74) *Attorney, Agent, or Firm* — Birch, Stewart, Kolasch & Birch, LLP

(57) ABSTRACT

A solar cell module includes a plurality of solar cells each including a semiconductor substrate, and first electrodes and second electrodes formed on the semiconductor substrate, a plurality of lines connected to the first and second electrodes of first and second solar cells, which are positioned adjacent to each other among the plurality of solar cells, the plurality of lines using a conductive adhesive or insulated from the first and second electrodes of the first and second solar cells through an insulating layer, and a connector positioned between the first and second solar cells and connected to the plurality of lines. A width of the connector is equal to or greater than at least one of a first distance between the first solar cell and the connector or a second distance between the second solar cell and the connector.

21 Claims, 22 Drawing Sheets

(56) References Cited

U.S. PATENT DOCUMENTS

2013/0340804 A1* 12/2013 Moon ................ H01L 31/0516
                                                              136/244
2014/0102515 A1    4/2014  Sakuma et al.
2015/0059831 A1    3/2015  Fukumochi et al.

FOREIGN PATENT DOCUMENTS

| EP | 2911207 A1 | 8/2015 |
|----|-----------|--------|
| JP | 2011-3724 A | 1/2011 |
| JP | 2012-74414 A | 4/2012 |
| JP | 2013-8785 A | 1/2013 |
| JP | 2014/7384 A | 1/2014 |
| KR | 10-2012-0116120 A | 10/2012 |
| KR | 10-2012-0131301 A | 12/2012 |
| WO | WO 2008/090718 A1 | 7/2008 |
| WO | WO 2009/025147 A1 | 2/2009 |
| WO | WO 2013/168612 A1 | 11/2013 |

* cited by examiner

SOLAR CELL MODULE

CROSS-REFERENCE TO RELATED APPLICATION

This application claims priority to and the benefit of Korean Patent Application No. 10-2014-0074609 filed in the Korean Intellectual Property Office on Jun. 18, 2014 and 10-2014-0128553 filed in the Korean Intellectual Property Office on Sep. 25, 2014, the entire contents of which are incorporated herein by reference.

BACKGROUND OF THE INVENTION

Field of the Invention

Embodiments of the invention relate to a solar cell module.

Description of the Related Art

A solar cell generally includes a substrate and an emitter region, which are formed of semiconductors of different conductive types, for example, a p-type and an n-type, and electrodes respectively connected to the substrate and the emitter region. A p-n junction is formed at an interface between the substrate and the emitter region.

The solar cell using the semiconductor substrate may be classified into a conventional solar cell and a back contact solar cell depending on a structure.

The conventional solar cell is configured such that an emitter region is positioned on a front surface of a substrate, an electrode connected to the emitter region is positioned on the front surface of the substrate, and an electrode connected to the substrate is positioned on a back surface of the substrate. The back contact solar cell is configured such that an emitter region is positioned on a back surface of a substrate, and all of electrodes are positioned on the back surface of the substrate.

Because all of the electrodes of the back contact solar cell are formed on the back surface of the substrate, the electrodes formed on the back surface of the substrate are connected in series to electrodes of an adjacent solar cell through an interconnector or a separate conductive metal. Hence, a solar cell module may be manufactured.

SUMMARY OF THE INVENTION

Embodiments of the invention provide a solar cell module capable of further improving the efficiency and the structural stability.

In one aspect, there is a solar cell module comprising a plurality of solar cells each including a semiconductor substrate, and first electrodes and second electrodes which are formed on the semiconductor substrate and collect carriers of different conductive types; a plurality of lines connected to the first and second electrodes of a first solar cell and a second solar cell, which are positioned adjacent to each other among the plurality of solar cells, the plurality of lines using a conductive adhesive for the series connection of the first and second solar cells or insulated from the first and second electrodes of the first and second solar cells through an insulating layer; and a connector positioned between the first solar cell and the second solar cell and connected to the plurality of lines, wherein a width of the connector is equal to or greater than at least one of a first distance between the first solar cell and the connector or a second distance between the second solar cell and the connector, and wherein an application area of the insulating layer on the connector is larger than an application area of the conductive adhesive on the connector.

An overlap area between an end of each line and the connector may be equal to or less than the width of the connector.

The overlap area between the end of each line and the connector may be equal to or greater than the width of the connector*⅓.

The connector may include a first surface, on which light is incident, and a second surface opposite the first surface, and all of the plurality of lines may be connected to the second surface of the connector.

The first surface of the connector may include a plurality of uneven portions each having a different inclined angle.

The second surface of the connector may include the same material as at least one of materials forming the plurality of lines.

A material forming the first surface of the connector may be different from a material forming the second surface of the connector.

A length of the connector may be equal to or greater than a distance between two lines positioned on uppermost and lowermost sides among the plurality of lines and may be less than a sum of a width of the first solar cell and a distance between strings of the plurality of solar cells.

A middle width of the connector may be less than an edge width of the connector.

A maximum difference between the edge width of the connector and the middle width of the connector may be 10 mm.

The first electrodes and the second electrodes may be alternately formed on a back surface of the semiconductor substrate in parallel with each other. The plurality of lines may include a first line connecting the first electrodes of the first solar cell to the second electrodes of the second solar cell and a second line connecting the second electrodes of the first solar cell to the first electrodes of the second solar cell.

The first line may be connected to the first electrodes of the first solar cell and the second electrodes of the second solar cell through a conductive adhesive and may be insulated from the second electrodes of the first solar cell and the first electrodes of the second solar cell through an insulating layer. The second line may be connected to the second electrodes of the first solar cell and the first electrodes of the second solar cell through the conductive adhesive and may be insulated from the first electrodes of the first solar cell and the second electrodes of the second solar cell through the insulating layer.

The first line and the second line may face each other on the connector at a distance which is equal to or less than the width of the connector.

The solar cell module may further comprise a plurality of strings each having a column of the plurality of solar cells connected through the connector, and a bushing bar configured to connect a first string and a second string, which are positioned adjacent to each other among the plurality of strings. A cross-sectional area of the connector may be less than a cross-sectional area of the bushing bar.

A forming material of the bushing bar, a forming material of the connector, and a forming material of the plurality of lines may commonly include at least one material.

The bushing bar may include a first surface, on which light is incident, and a second surface opposite the first surface. All of the plurality of lines connected to the bushing bar may be connected to the second surface of the bushing bar. The first surface of the bushing bar may include a plurality of uneven portions each having an inclined surface, which is inclined in one direction.

A distance between the first solar cell and the connector and a distance between the second solar cell and the connector may be 50 μm to 3 mm.

The width of the connector may be 0.1 mm to 20 mm, and a thickness of the connector may be 0.015 mm to 2 mm. The thickness of the connector is greater than a thickness of at least one of the first solar cell or the second solar cell. The thickness of the connector may be equal to or less than a thickness of at least one of the first line or the second line.

A cross-sectional area of the first line may be different from a cross-sectional area of the second line.

A cross-sectional area of the first electrode of the first solar cell may be smaller than a cross-sectional area of the first electrode of the second solar cell. The cross-sectional area of the first line may be larger than the cross-sectional area of the second line.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It should be noted that a detailed description of known arts will be omitted if it is determined that the known arts can obscure the embodiments of the invention.

In the following description, "front surface" may be one surface of a semiconductor substrate, on which light is directly incident, and "back surface" may be a surface opposite the one surface of the semiconductor substrate, on which light is not directly incident or reflective light may be incident.

Further, in the following description, the fact that lengths or widths of two different components are the same as each other means that they are the same as each other within a margin of error of 10%.

Example embodiments of the invention will be described with reference to FIGS. 1 to 21.

Figure 1:
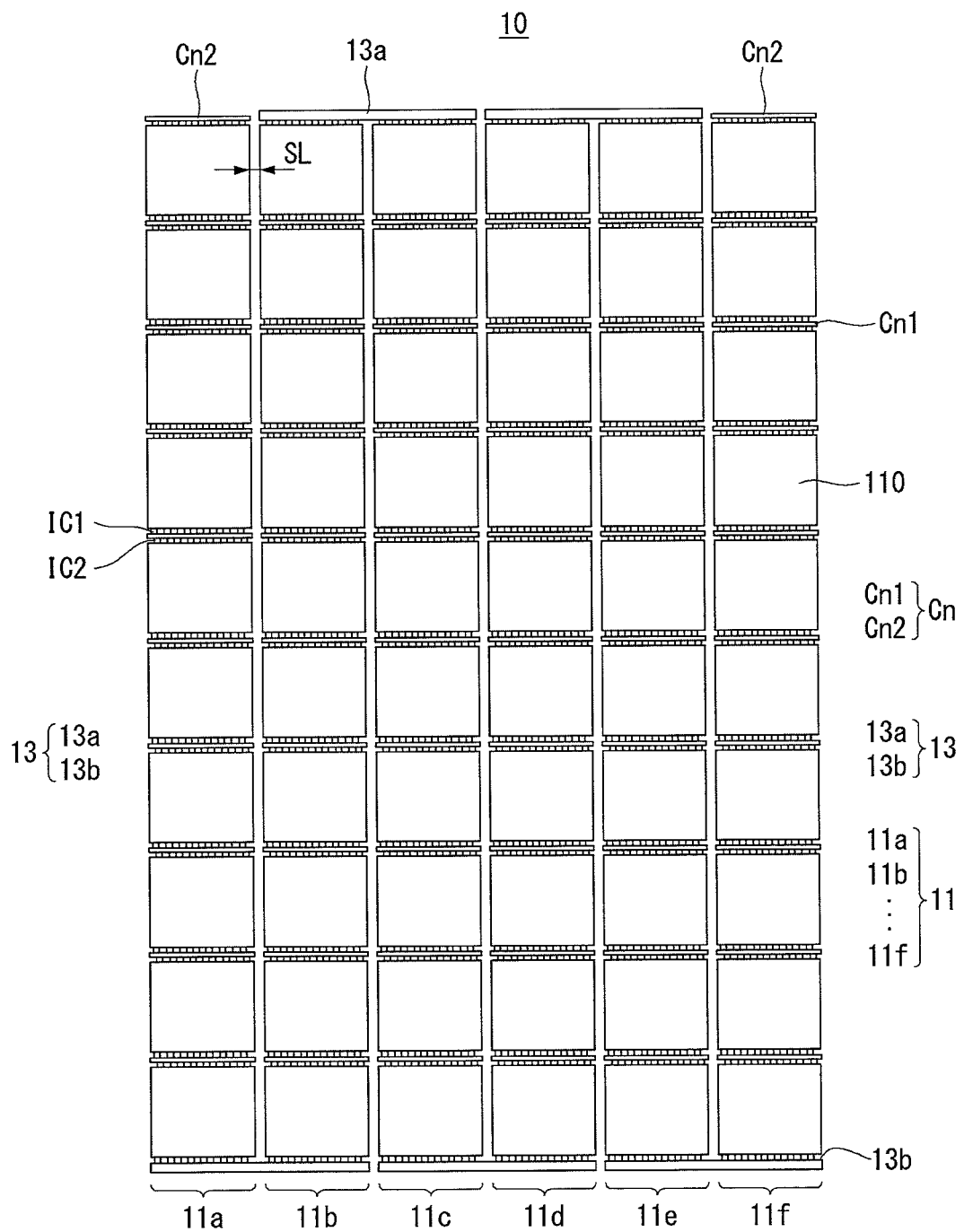
FIG. 1 shows an entire shape of a solar cell module according to an example embodiment of the invention.
Figure 2:
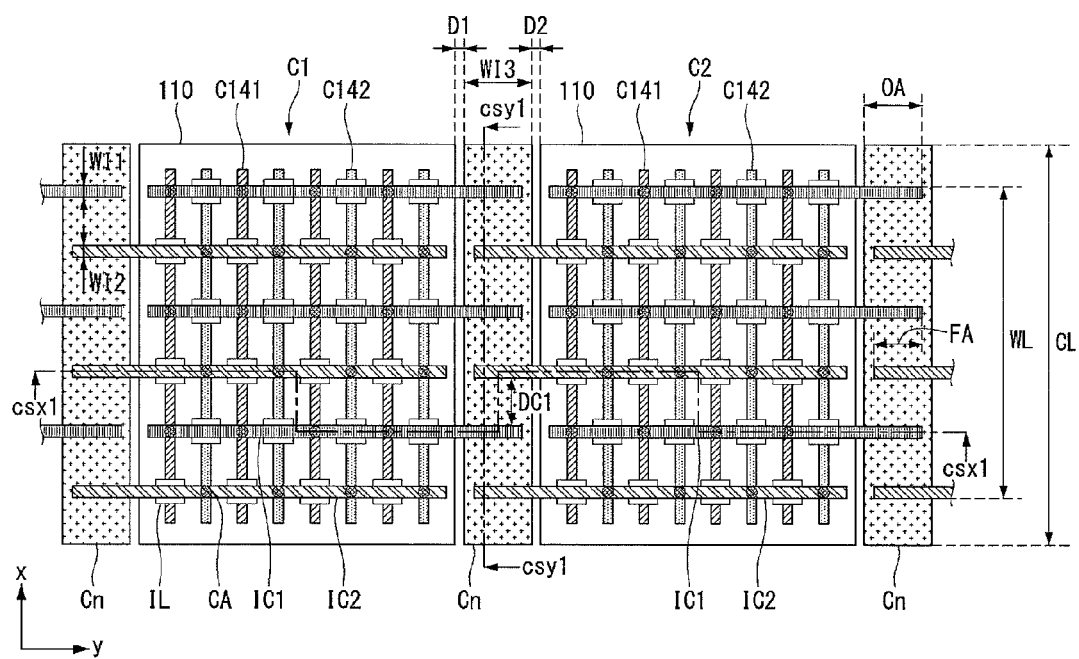
FIG. 2 shows a back plane of a solar cell module according to a first embodiment of the invention.
Figure 3:
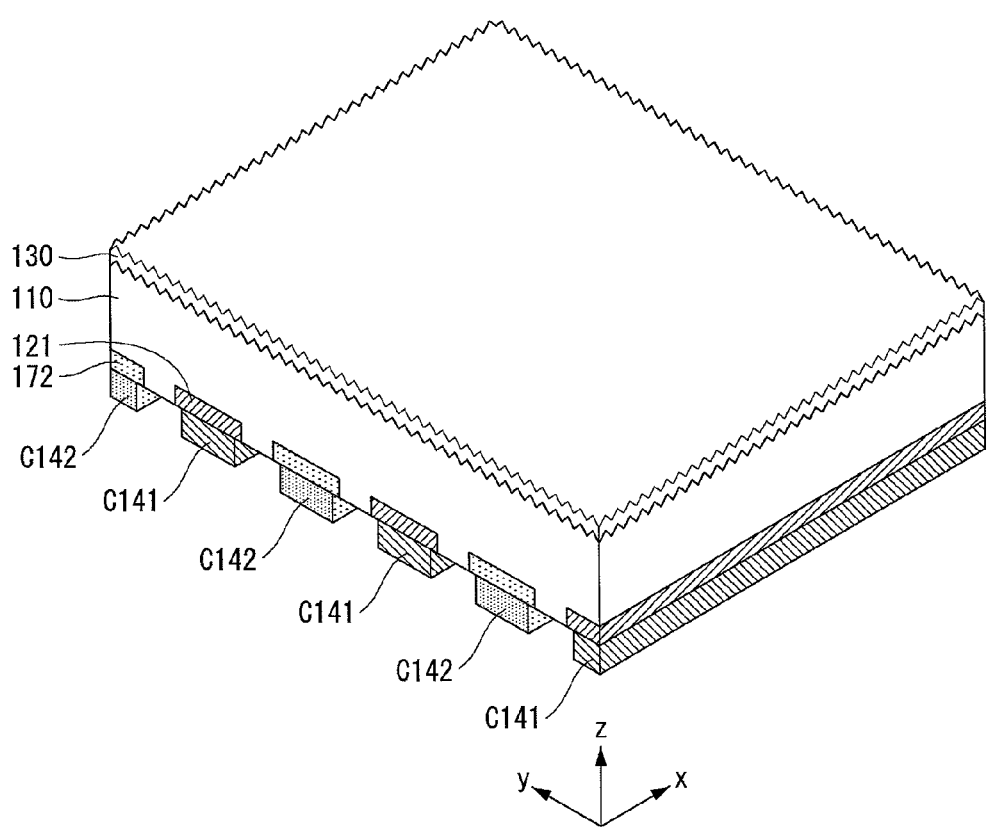
FIG. 3 shows an example of a solar cell applied to FIG. 2.
Figure 4:
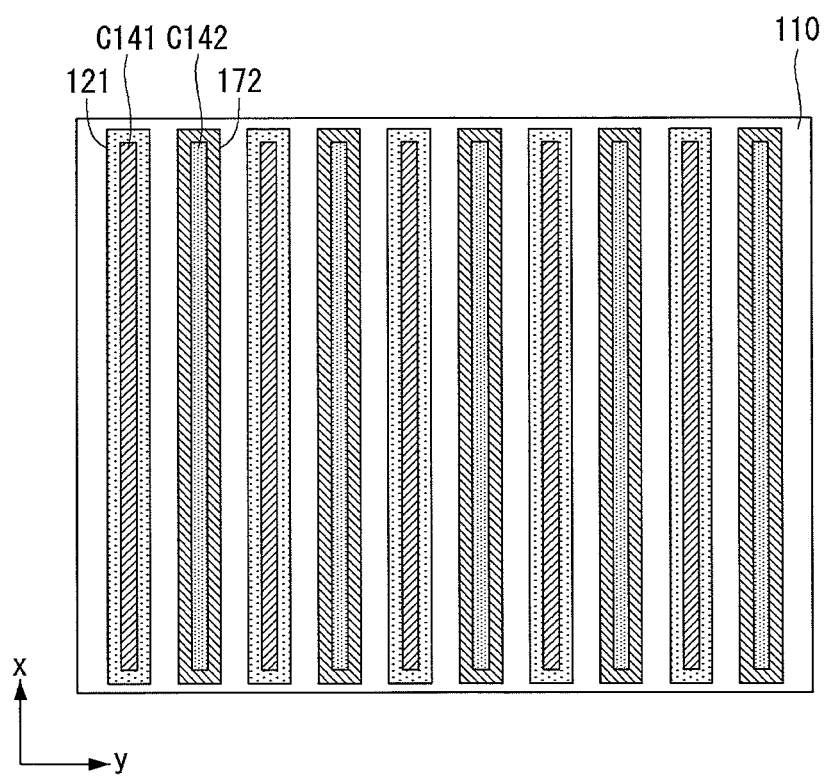
FIG. 4 shows a pattern of first and second electrodes of a solar cell shown in FIG. 3.
Figure 5:
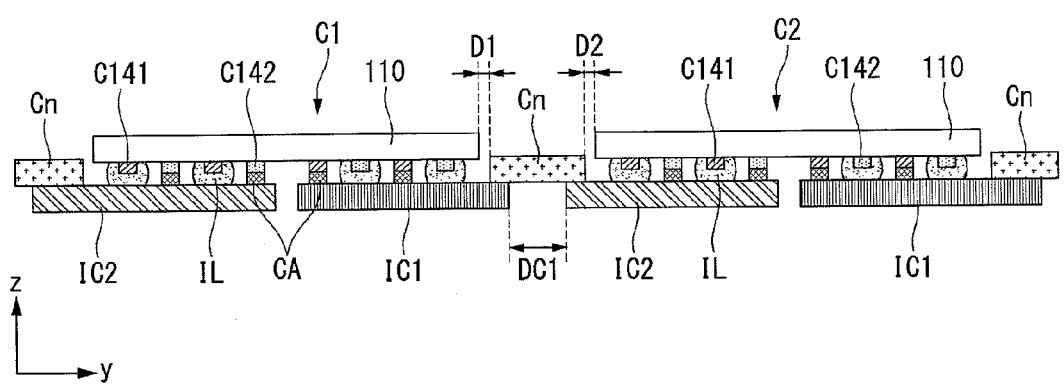
FIG. 5 is a cross-sectional view taken along line csx1-csx1 of FIG. 2.
Figure 6:
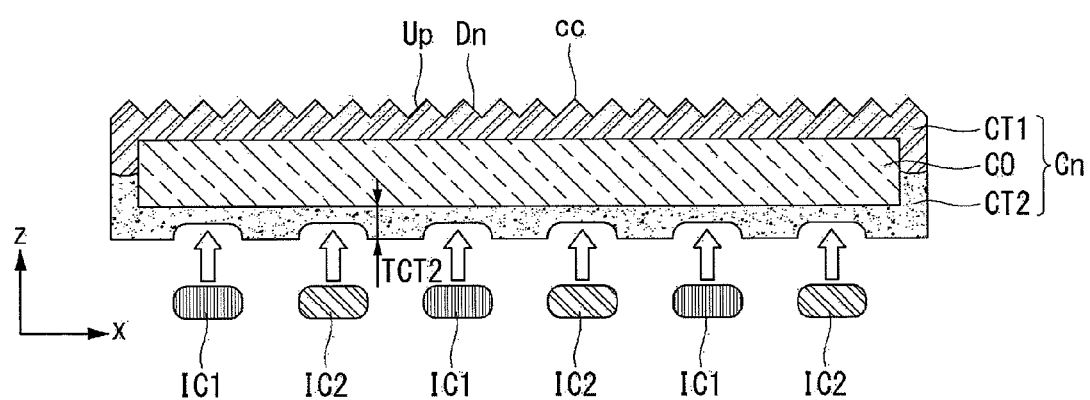
FIG. 6 is a cross-sectional view taken along line csy1-csy1 of FIG. 2 for explaining in detail a connector.
Figure 7:
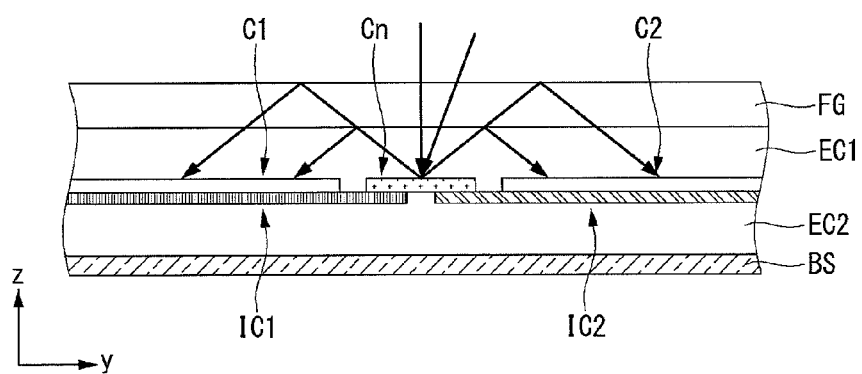
FIG. 7 illustrates a light reflection effect of a connector.

FIG. 1 shows an entire shape of a solar cell module according to an example embodiment of the invention. FIG. 2 shows a back plane of a solar cell module according to a first embodiment of the invention. FIG. 3 shows an example of a solar cell applied to FIG. 2. FIG. 4 shows a pattern of first and second electrodes of a solar cell shown in FIG. 3. FIG. 5 is a cross-sectional view taken along line csx1-csx1 of FIG. 2. FIG. 6 is a cross-sectional view taken along line csy1-csy1 of FIG. 2 for explaining in detail a connector. FIG. 7 illustrates a light reflection effect of a connector.

As shown in FIG. 1, a solar cell module 10 according to the embodiment of the invention includes a plurality of strings 11, each of which is comprised of a plurality of solar cells connected through connectors Cn in a column, and a bushing bar 13 connecting the adjacent strings 11.

Each string 11 includes a plurality of solar cells 110 connected in a column, and the adjacent solar cells are connected through the connector Cn. For example, FIG. 1 shows that the ten solar cells 110 form one string of one column, and first to sixth strings 11a to 11f are formed.

In the first to sixth strings 11a to 11f, the connector Cn includes a first connector Cn1 which is disposed between the two adjacent solar cells 110 and connects the two adjacent solar cells 110, and a second connector Cn2 connected only to one end of the first string 11a and one end of the sixth string 11f.

The first connector Cn1 and the second connector Cn2 have the same configuration, except a disposition position. Because of a position difference between the first and second connectors Cn1 and Cn2, the second connector Cn2 is connected only to one of a first line IC1 and a second line IC2, and the first connector Cn1 is connected to both the first line IC1 and the second line IC2. Further, the first and second connectors Cn1 and Cn2 may have different shapes of uneven portions formed on surfaces of the first and second connectors Cn1 and Cn2. This is described later.

The number of first connectors Cn1, which are positioned between the adjacent solar cells 110 and connect the adjacent solar cells 110, is less than the number of solar cells 110 belonging to one string by one. Therefore, a total of nine first connectors Cn1 are used in one string, and a total of two second connectors Cn2 are respectively used in the first string 11a and the sixth string 11f.

As described above, each string 11 includes the plurality of solar cells 110 connected through the connector Cn, and the solar cell module 10 includes at least two strings. Therefore, the plurality of solar cells 110 constituting the solar cell module 10 may be entirely arranged in a m*n matrix form.

The bushing bars 13 are respectively positioned on and under of the string and connect the two adjacent strings. In the embodiment disclosed herein, because the solar cell module 10 includes the six strings, the five bushing bars 13 are used to connect the strings in series. The bushing bar 13 may include an upper bushing bar 13a and a lower bushing bar 13b depending on a disposition position.

The upper bushing bar 13a is positioned above the string 11, and the lower bushing bar 13b is positioned below the string 11.

As shown in FIG. 1, the lower bushing bar 13b is used in the connection between the first and second strings 11a and 11b, the connection between the third and fourth strings 11c and 11d, and the connection between the fifth and sixth strings 11e and 11f. The upper bushing bar 13a is used in the connection between the second and third strings 11b and 11c and the connection between the fourth and fifth strings 11d and 11e.

As described above, because the bushing bar 13 connects the strings, a load of the bushing bar 13 is greater than a load of the connector Cn. Because of this, it may be preferable, but not required, that the bushing bar 13 is formed of a material having the conductivity greater than the connector Cn, or has a cross-sectional area greater than the connector Cn. For example, a width of the bushing bar 13 may be greater than a width of the connector Cn, or a thickness of the bushing bar 13 may be greater than a thickness of the connector Cn.

In another example, the bushing bar 13 and the connector Cn may be manufactured to have the same configuration. For example, the bushing bar 13 may have the same configuration as the connector Cn shown in FIG. 6.

The bushing bar 13 may include the same material as at least one of metal materials forming the connector Cn. For example, if the connector Cn includes one of lead (Pb) and tin (Sn), the bushing bar 13 may include one of lead (Pb) and tin (Sn).

Because the bushing bar 13 and the connector Cn have to be physically and solidly attached to the first and second lines IC1 and IC2, it is be preferable, but not required, that they have a rectangular ribbon cross section. However, it is be preferable, but not required, that the first and second lines IC1 and IC2 have a circular wire cross section unlike the bushing bar 13 and the connector Cn, so that the bending of the solar cell is not generated through a reduction in a heat deformation.

The first and second lines IC1 and IC2 connected to the connector Cn are connected to a back surface of the connector Cn, and the first and second lines IC1 and IC2 connected to the bushing bar 13 are connected to a back surface of the bushing bar 13. Thus, it is be preferable, but not required, that the connection between the first and second lines IC1 and IC2 and the bushing bar 13 and the connector Cn is not seen when viewed from the front of the solar cell module.

The embodiment of the invention described that the second connector Cn2 has the same configuration as the first connector Cn1. However, the bushing bar 13 may be configured as the second connector Cn2.

So far, the entire shape of the solar cell module 10 was described. Hereinafter, the connection of the two adjacent solar cells through the first line IC1, the second line IC2, and the connector Cn is described.

As shown in FIG. 2, the solar cell module according to the embodiment of the invention includes a plurality of solar cells C1 and C2, a plurality of first and second lines IC1 and IC2 connected to a plurality of first and second electrodes C141 and C142 formed on back surfaces of the plurality of solar cells C1 and C2, and a connector Cn which is connected to the plurality of first and second lines IC1 and IC2 and connects the plurality of solar cells C1 and C2 in series.

In the embodiment disclosed herein, each of the plurality of solar cells C1 and C2 includes a semiconductor substrate 110 and the plurality of first and second electrodes C141 and C142 which are formed on a back surface of the semiconductor substrate 110 and are separated from each other.

More specifically, as shown in FIGS. 3 and 4, an example of the solar cell according to the embodiment of the invention may include the semiconductor substrate 110, an anti-reflection layer 130, a plurality of emitter regions 121, a plurality of back surface field regions 172, the plurality of first electrodes C141, and the plurality of second electrodes C142.

The anti-reflection layer 130 and the back surface field regions 172 may be omitted in the embodiment of the invention, if necessary or desired. In the following description, the embodiment of the invention is described using the solar cell including the anti-reflection layer 130 and the back surface field regions 172 as an example.

The semiconductor substrate 110 may be a semiconductor substrate formed of silicon of a first conductive type, for example, an n-type, though not required. The semiconductor substrate 110 may be formed by doping a semiconductor wafer formed of crystalline silicon material with impurities of the first conductive type, for example, the n-type.

The plurality of emitter regions 121 may be separated from one another inside the back surface opposite a front surface of the semiconductor substrate 110 and may extend in a first direction x parallel to one another. The plurality of emitter regions 121 may contain impurities of a second conductive type (for example, p-type) opposite the first conductive type (for example, n-type) of the semiconductor substrate 110.

Hence, a p-n junction may be formed by the semiconductor substrate 110 and the emitter region 121.

The plurality of back surface field regions 172 may be positioned inside the back surface of the semiconductor substrate 110 and may be separated from one another. The plurality of back surface field regions 172 may extend in the first direction x parallel to the plurality of emitter regions 121. Thus, as shown in FIGS. 3 and 4, the plurality of emitter regions 121 and the plurality of back surface field regions 172 may be alternately positioned at the back surface of the semiconductor substrate 110.

Each back surface field region 172 may be a region (for example, an $n^{++}$-type region) which is more heavily doped than the semiconductor substrate 110 with impurities of the same conductive type as the semiconductor substrate 110.

The plurality of first electrodes C141 may be physically and electrically connected to the plurality of emitter regions 121, respectively and may be formed on the back surface of the semiconductor substrate 110 along the emitter regions 121.

The plurality of second electrodes C142 may be formed on the back surface of the semiconductor substrate 110 along the plurality of back surface field regions 172 and may be physically and electrically connected to the semiconductor substrate 110 through the plurality of back surface field regions 172.

As shown in FIG. 4, the plurality of first electrodes C141 may extend in the first direction x and may be separated from one another in a second direction y crossing the first direction x.

Further, as shown in FIG. 4, the plurality of second electrodes C142 may extend in the first direction x and may be separated from one another in the second direction y.

The plurality of first and second electrodes C141 and C142 may be separated from each other and may be electrically insulated from each other. Further, the plurality of first and second electrodes C141 and C142 may be alternately disposed.

The plurality of first and second electrodes C141 and C142 thus configured may include the same material as at least one of the metal materials forming the connector Cn or the busing bar 13. The connector Cn or the busing bar 13 may be connected to the plurality of first and second electrodes C141 and C142 through a soldering method using a melting and coupling process. Thus, when the plurality of first and second electrodes C141 and C142 include the same metal material as the connector Cn or the busing bar 13, a connection strength can increase. Further, the plurality of first and second electrodes C141 and C142, the connector Cn, and the busing bar 13 can be simultaneously connected to one another.

In the solar cell having the above-described structure according to the embodiment of the invention, holes collected by the first electrodes C141 and electrons collected by the second electrodes C142 may be used as electric power of an external device through an external circuit device.

The solar cell applied to the solar cell module according to the embodiment of the invention is not limited to FIGS. 3 and 4. The components of the solar cell may vary in many forms, except that the first and second electrodes C141 and C142 included in the solar cell are formed on the back surface of the semiconductor substrate 110.

For example, the embodiment of the invention may be applied to a metal wrap through (MWT) solar cell, which is configured such that a portion of the first electrode C141 and the emitter region 121 are positioned on the front surface of the semiconductor substrate 110, and the portion of the first electrode C141 is connected to a remaining portion of the first electrode C141 formed on the back surface of the semiconductor substrate 110 through a hole of the semiconductor substrate 110.

As shown in FIG. 2, the plurality of solar cells each having the structure shown in FIGS. 3 and 4 may be arranged in the second direction y. For example, the first solar cell C1 and the second solar cell C2 may be arranged in the second direction y.

A longitudinal direction of the first and second electrodes C141 and C142 included in the first and second solar cells C1 and C2 may correspond to the first direction x.

The first and second solar cells C1 and C2 may be connected in series to each other through the first and second lines IC1 and IC2 and the connector Cn in a state where the first and second solar cells C1 and C2 extend in the second direction y as described above, thereby forming the solar cell module. The plurality of solar cells are connected through the connector Cn in a state where the plurality of solar cells are disposed in the second direction y, thereby forming one string.

In the embodiment disclosed herein, the first and second lines IC1 and IC2 and the connector Cn may include a conductive metal material. The first and second lines IC1 and IC2 may be connected to the back surface of the semiconductor substrate 110 of each solar cell and then may be connected to the connector Cn for the serial connection of the solar cells.

Each of the plurality of first and second lines IC1 and IC2 may be configured as a conductive wire, in which a width and a thickness are the same as each other, or a ribbon shape, in which a width is greater than a thickness.

More specifically, the plurality of first lines IC1 may be connected to the plurality of first electrodes C141 included in one of the two adjacent solar cells among the plurality of solar cells C1 and C2 through a conductive adhesive CA and may be insulated from the plurality of second electrodes C142 of the one solar cell through an insulating layer IL. Further, the plurality of second lines IC2 may be connected to the plurality of second electrodes C142 included in the other solar cell of the two adjacent solar cells through the conductive adhesive CA and may be insulated from the plurality of first electrodes C141 of the other solar cell through the insulating layer IL.

For example, as shown in FIGS. 2 and 5, the plurality of first lines IC1 may be connected only to the plurality of first electrodes C141 included in the first solar cell C1 of the two adjacent solar cells C1 and C2.

Each of the plurality of first lines IC1 may extend in the second direction y crossing the longitudinal direction of the plurality of first electrodes C141. As shown in FIG. 2, when viewed from the back surface of the semiconductor substrate 110, the plurality of first lines IC1 may extend to the outside of the semiconductor substrate 110.

As shown in FIGS. 2 and 5, each of the plurality of first lines IC1 may be connected to the plurality of first electrodes C141 using the conductive adhesive CA.

The conductive adhesive CA may use a solder paste, which is excellent in attaching metal materials, a conductive adhesive paste, in which metal particles are included in an insulating resin, or a conductive adhesive film.

Further, the insulating layer IL may be positioned between the plurality of first lines IC1 and the plurality of second electrodes C142 for the insulation between the plurality of first lines IC1 and the plurality of second electrodes C142.

The material of the insulating layer IL is not particularly limited as long as it is an insulating material. For example, an insulating resin, such as epoxy, may be used for the insulating layer IL.

Further, it may be preferable, but not required, that a melting temperature of the material of the insulating layer IL is equal to or higher than about 400° C., and its curing temperature is about 210° C. to 250° C.

An application area of the insulating layer IL is larger than an application area of the conductive adhesive CA. In other words, as shown, the application area of the conductive adhesive CA is smaller than the application area of the insulating layer IL. The conductive adhesive CA is configured to electrically connect the plurality of first lines IC1 and the plurality of second lines IC2 to the plurality of first electrodes C141 and the plurality of second electrodes C142, respectively. On the other hand, the insulating layer IL is configured to insulate the plurality of first lines IC1 and the plurality of second lines IC2 from the plurality of first electrodes C141 and the plurality of second electrodes C142, respectively. Thus, when the application area of the conductive adhesive CA increases, a portion, which has to be insulated, may be electrically connected through the conductive adhesive CA. Because of this, the embodiment of the invention decreases the application area of the conductive adhesive CA and increases the application area of the insulating layer IL in consideration of this.

Next, the plurality of second lines 1C2 may overlap the plurality of second electrodes C142 included in the other of the two adjacent solar cells among the plurality of solar cells and may be connected to the plurality of second electrodes C142 of the other solar cell.

For example, as shown in FIGS. 2 and 5, the plurality of second lines IC2 may overlap the plurality of second electrodes C142 included in the second solar cell C2 of the two adjacent solar cells C1 and C2 and may be connected to the plurality of second electrodes C142 of the second solar cell C2.

Each of the plurality of second lines IC2 may extend in the second direction y crossing the longitudinal direction of the plurality of second electrodes C142. As shown in FIG. 1, when viewed from the back surface of the semiconductor substrate 110, the plurality of second lines IC2 may extend to the outside of the semiconductor substrate 110.

As shown in FIGS. 2 and 5, each of the plurality of second lines IC2 may be connected to the plurality of second electrodes C142 using the above-described conductive adhesive CA.

Further, the above-described insulating layer IL may be positioned between the plurality of second lines IC2 and the plurality of first electrodes C141 for the insulation between the plurality of second lines IC2 and the plurality of first electrodes C141.

So far, the embodiment of the invention described that the first lines IC1 are connected to the first electrodes C141 of the first solar cell C1 and the second lines IC2 are connected to the second electrodes C142 of the second solar cell C2. However, as shown in FIGS. 2 and 5, the second lines IC2 may be connected to the second electrodes C142 included in the first solar cell C1 using the conductive adhesive CA, and also the first lines IC1 may be connected to the first electrodes C141 included in the second solar cell C2 using the conductive adhesive CA.

Namely, the plurality of first and second lines IC1 and IC2 may be connected to the plurality of first and second electrodes C141 and C142 of each solar cell at the back surface of the semiconductor substrate 110 of each solar cell.

Thus, as shown in FIGS. 2 and 5, the first lines IC1 may be connected to the first electrodes C141 of each solar cell, and the second lines IC2 may be connected to the second electrodes C142 of each solar cell.

As shown in FIGS. 2 and 5, a portion of the plurality of first and second lines IC1 and IC2 connected to the back surface of each solar cell, which extends to the outside of the semiconductor substrate 110 of each solar cell, may be connected to the back surface of the connector Cn positioned between the first and second solar cells C1 and C2. Hence, the first and second solar cells C1 and C2 may form one string.

In this instance, the longitudinal direction of the connector Cn may be the first direction x, which is the same as the longitudinal direction of the first and second electrodes C141 and C142 of each solar cell.

In the embodiment disclosed herein, one connector Cn or the plurality of connectors Cn may be formed. For example, the first embodiment of the invention describes that the connector Cn is configured as one metal pad extending in the first direction x.

As shown in FIGS. 2 and 5, the connector Cn may be positioned between the semiconductor substrates 110 of the solar cells. Namely, the connector Cn may not overlap the semiconductor substrate 110 of each solar cell and may be separated from the semiconductor substrate 110 of each solar cell. For example, as shown in FIG. 2, when viewed from a back surface of the string, the connector Cn may be separated from the semiconductor substrate 110 of the first solar cell C1 by a distance D1, and the connector Cn may be separated from the semiconductor substrate 110 of the second solar cell C2 by a distance D2. The distance D1 and the distance D2 may be the same as or different from each other.

More specifically, each of the distances D1 and D2 is determined depending on a value subtracting a width WI3 of the connector Cn from a distance between the first solar cell C1 and the second solar cell C2. For example, each of the distances D1 and D2 may be 50 μm to 3 mm. For example, the distances D1 and D2 may be equally 100 μm. For example, one of the distances D1 and D2 may be 500 μm, and the other may be 200 μm.

Setting the distances D1 and D2 as described above is to prevent the short circuit through the connection between the semiconductor substrates 110 of the solar cells C1 and C2 and the connector Cn, to minimize an amount of light incident on the distances D1 and D2 formed in spaces between the semiconductor substrates 110 of the solar cells C1 and C2 and the connector Cn, and to maximize the electricity generation efficiency of the solar cell module.

When the connector Cn is positioned between the semiconductor substrates 110 of the solar cells as described above, the connector Cn may reflect light incident between the solar cells and may cause the light to be again incident on the solar cell. Further, the connector Cn between the semiconductor substrates 110 may function to fix the first and second lines IC1 and IC2 and thus may further improve the structural stability of the solar cell module.

The width WI3 of the connector Cn is equal to or greater than at least one of the distances D1 and D2 in consideration of a sufficient adhesive strength and a distance between the adjacent solar cells. Preferably, the width WI3 of the connector Cn may be 0.1 mm to 20 mm. Further, a thickness of the connector Cn may be 0.015 mm to 2 mm.

When the width WI3 of the connector Cn excessively decreases, the sufficient adhesive strength cannot be obtained. Further, an amount of light reflected from the connector Cn excessively decreases, and the electricity generation efficiency is reduced. Thus, it is preferable, that the width WI3 of the connector Cn is equal to or greater than at least one of the distances D1 and D2.

A length CL of the connector Cn is equal to or greater than a distance WL between the two lines positioned on the uppermost and lowermost sides among the plurality of first and second lines IC1 and IC2 connected to the connector Cn.

Further, the length CL of the connector Cn is less than a sum of a width of the solar cell and a distance SL between the strings.

If the length CL of the connector Cn is less than the distance WL, a portion of all of the first and second lines IC1 and IC2, which have to be connected to the connector Cn, may not be normally connected to the connector Cn. Further, if the length CL of the connector Cn is equal to or greater than the sum of the width of the solar cell and the distance SL between the strings, the connector Cn may be electrically connected to the adjacent string.

It is preferable, but not required, that the thickness of the connector Cn is equal to or less than a thickness of the first line IC1 or the second line IC2 in consideration of the manufacturing process. When the thickness of the connector Cn made of the metal material increases, it is not easy to bend the connector Cn because the flexibility of the connector Cn decreases. Therefore, it may be difficult to attach the first line IC1 or the second line IC2 to the connector Cn. Furthermore, if the flexibility of the connector Cn decreases, a crack may be generated in an adhesive portion having the small flexibility when the first line IC1 or the second line IC2 is thermally deformed.

FIG. 2 shows that the total number of first and second lines IC1 and IC2 connected to the back surface of the semiconductor substrate 110 of each solar cell using the conductive adhesive CA is six, as an example. However, the embodiment of the invention is not limited thereto. The total number of first and second lines IC1 and IC2 connected to the back surface of the semiconductor substrate 110 of each solar cell may be 6 to 40. More preferably, if the size of the solar cell is 156 mm*156 mm, the total number of first and second lines IC1 and IC2 may be 28 to 32.

As shown in FIGS. 2 and 5, the first line IC1 connected to the first solar cell C1 and the second line IC2 connected to the second solar cell C2 are positioned on different lines and are independently and individually formed. Hence, an end of the first line IC1 and an end of the second line IC2, each of which overlaps the connector Cn, may be separated from each other by a distance DC1. Thus, the end of the first line IC1 and the end of the second line IC2 may be offset.

For example, when the solar cell, in which the connection between the first and second lines IC1 and IC2 and the first and second electrodes C141 and C142 is bad, is generated among the plurality of solar cells, the first and second lines IC1 and IC2 of the bad solar cell may be disconnected from the connector Cn. As a result, only the bad solar cell may be easily replaced.

Furthermore, it may be preferable, but not required, that an overlap area OA between the connector Cn and one of the first and second lines IC1 and IC2 is equal to or less than the width WI3 of the connector Cn and is equal to or greater than (the width WI3 of the connector Cn*⅓). When the overlap area OA is greater than the width WI3 of the connector Cn, it is detrimental in terms of design because the first and second lines IC1 and IC2 protrude to the outside of the connector Cn. Further, a portion, which does not have to be connected, may be connected. When the overlap area OA is less than (the width WI3 of the connector Cn*⅓), a junction area decreases. Hence, the first and second lines IC1 and IC2 are not stably connected to the connector Cn.

Furthermore, it may be preferable, but not required, that the first and second lines IC1 and IC2 are disposed on the connector Cn. A facing distance FA between the first and second lines IC1 and IC2 is equal to or less than the width of the connector Cn. Carriers collected by the electrodes are transferred from the connector Cn to the first and second lines IC1 and IC2 or from the first and second lines IC1 and IC2 to the connector Cn. Thus, when the first and second lines IC1 and IC2 face each other on the connector Cn, the carriers can be efficiently transferred.

On the contrary, the first line IC1 and the second line IC2 overlapping the connector Cn may not be separated from each other and may be connected to each other. This is described in detail in a second embodiment of the invention.

The structure of the connector Cn is described in detail below with reference to FIG. 6.

As shown in FIG. 6, the connector Cn may include a core CO formed of a first metal material with conductivity, a first coating part CT1 coated on an incident surface of the core CO, and a second coating part CT2 coated on a back surface of the core CO.

In the embodiment disclosed herein, the first metal material of the core CO may be a metal material with good conductivity, for example, copper (Cu), aluminum (Al), and nickel (Ni).

As shown in FIG. 6, a plurality of uneven portions may be formed on an incident surface of the first coating part CT1. Each uneven portion of the first coating part CT1 may have a pyramid shape so as to scatter light incident on the connector Cn.

Further, the first coating part CT1 may include a second metal material having a surface reflectance greater than the first metal material, so as to increase a reflectance resulting from the connector Cn. For example, the second metal material may use silver (Ag) having a surface reflectance greater than copper (Cu) usable as the first metal material.

The second coating part CT2 may include a third metal material having a melting point lower than the first and second metal materials, so as to further improve a contact strength and a contact resistance between the second coating part CT2 and the plurality of first and second lines IC1 and IC2 connected to the back surface of the connector Cn.

For example, the third metal material may include at least one of tin (Sn) or indium (In), which has a melting point lower than copper (Cu) and silver (Ag) usable as the first and second metal materials and has a good adhesive strength. More specifically, examples of the third metal material may include an alloy, such as SnPb, SnAgCu, SnZnBi, SnCu, and SnAg based on Sn, or In. As described above, when the second coating part CT2 includes a solder material, the connector Cn may be physically and electrically connected to the first and second lines IC1 and IC2 through the soldering method for applying heat to a base material and melting it to couple them. Alternatively, the connector Cn may be connected to the first and second lines IC1 and IC2 through a conductive film, in which conductive metal particles are inserted into a polymer, or the above-described conductive adhesive.

As shown in FIG. 6, a back surface of the second coating part CT2 may have a plurality of grooves HIC, into which the plurality of first and second lines IC1 and IC2 are inserted. Namely, each of the plurality of grooves HIC formed on the back surface of the second coating part CT2 may have the structure, into which the plurality of first and second lines IC1 and IC2 can be inserted.

Hence, a connection area between the second coating part CT2 and the first and second lines IC1 and IC2 may increase, and a contact resistance therebetween may be minimized. Further, when the plurality of first and second lines IC1 and IC2 are connected to the connector Cn, the plurality of first and second lines IC1 and IC2 may be more easily aligned and fixed.

A thickness TCT2 of a portion of the second coating part CT2 not having the groove HIC may be 5 µm to 30 µm, so as to sufficiently show a connection strength of the second coating part CT2.

If the thickness of the second coating part CT2 is not sufficient, the plurality of first and second lines IC1 and IC2 may be connected to the connector Cn using the conductive adhesive CA.

However, as described above, when the thickness of the second coating part CT2 is 5 µm to 30 µm, the conductive adhesive CA is not separately necessary. Therefore, the manufacturing process may be further simplified, and the manufacturing cost may be further reduced.

As shown in FIG. 7, the string, in which the plurality of solar cells C1 and C2 are connected in series to each other through the first and second lines IC1 and IC2 and the connector Cn as described above, may be disposed between a transparent substrate FG and a first filler EC1 and between a second filler EC2 and a back sheet BS. In this state, the string, the transparent substrate FG, the first filler EC1, the second filler EC2, and the back sheet BS may be laminated together to form an integrated type module.

The transparent substrate FG may be formed of a glass material or a plastic material with the light transmission, and the first and second fillers EC1 and EC2 may be formed of a material with the elasticity and the insulation, for example, ethylene vinyl acetate (EVA). Further, the back sheet BS may be formed of an insulating material with a damp proofing function.

As shown in FIG. 7, when the connector Cn serving as a reflector is positioned between the plurality of solar cells, light incident between the solar cells may be again incident on the solar cells through the connector Cn and the transparent substrate FG. Hence, the efficiency of the solar cells may be further improved.

So far, the embodiment of the invention described that both the first and second lines IC1 and IC2 are fixed to a back surface of the connector Cn so that the connector Cn is positioned closer to the incident surface of the solar cell module. On the contrary, both the first and second lines IC1 and IC2 may be fixed to a front surface of the connector Cn, or may be fixed to different surfaces of the connector Cn.

FIG. 5 shows that the connector Cn does not have a plurality of uneven portions, as an example. However, as shown in FIGS. 6 and 8 to 11, the connector Cn may have a plurality of uneven portions on the incident surface of the connector Cn, so as to reflect light on the two adjacent solar cells.

More specifically, as shown in FIG. 6, the surface of the first coating part CT1 may have uneven portions CC having the uniform size. The uneven portion CC includes a rising inclined surface Up and a falling inclined surface Dn. Therefore, light incident on the uneven portion CC is reflected on the left side of the connector Cn at the rising inclined surface Up and is reflected on the right side of the connector Cn at the falling inclined surface Dn. As a result, the light incident on the connector Cn may be additionally incident on each of the two solar cells connected through the connector Cn due to the uneven portion CC.

Figure 8:
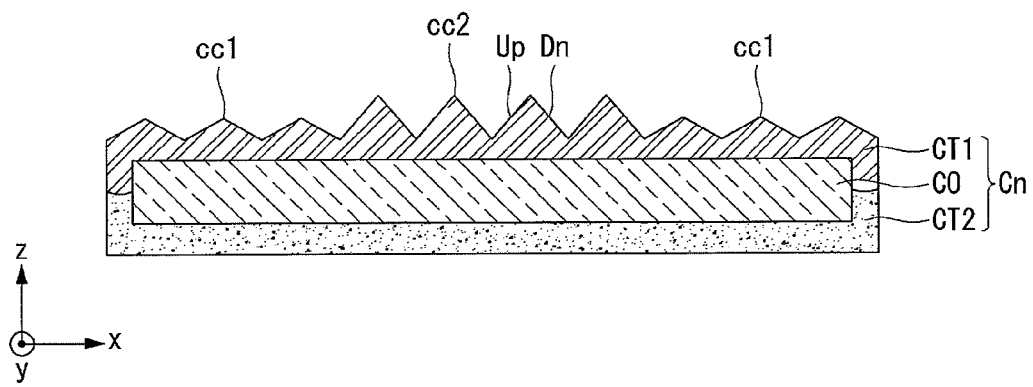
FIGS. 8 to 11 show various shapes of uneven portions of a connector.
Figure 9:
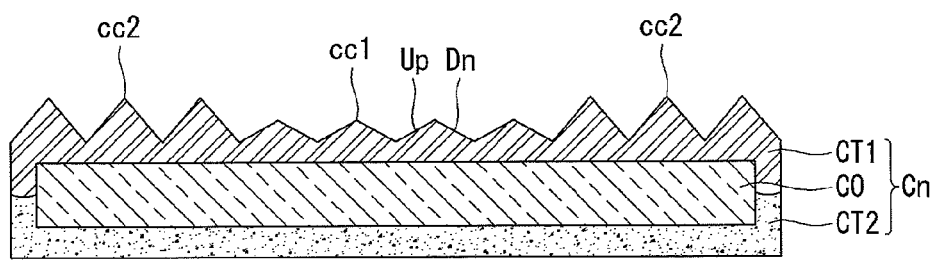

Alternatively, as shown in FIGS. 8 and 9, the surface of the first coating part CT1 may have first uneven portions CC1 and second uneven portions CC2 having the different sizes.

The uneven portion CC shown in FIGS. 8 and 9 is the same as the uneven portion CC shown in FIG. 6 in that the uneven portion CC includes a rising inclined surface Up and a falling inclined surface Dn.

The uneven portion CC shown in FIGS. 8 and 9 is different from the uneven portion CC shown in FIG. 6 in that the uneven portion CC has the different sizes depending on a position of the uneven portion CC. As shown in FIG. 8, the uneven portion CC includes a first uneven portion CC1 and a second uneven portion CC2 having the size greater than the first uneven portion CC1. In the embodiment disclosed herein, the size of the uneven portion indicates a cross-sectional area of the uneven portion.

The second uneven portions CC2 may be formed in the middle of the connector Cn based on a direction (i.e., the x-axis direction) crossing a longitudinal direction (i.e., the y-axis direction) of the connector Cn, and the first uneven portions CC1 may be formed in other portion. Alternatively, as shown in FIG. 9, the first uneven portions CC1 may be formed in the middle of the connector Cn, and the second uneven portions CC2 may be formed in other portion.

In the embodiment disclosed herein, the middle of the connector Cn corresponds to a middle part when dividing the connector Cn into three parts in the direction (i.e., the x-axis direction) crossing the longitudinal direction (i.e., the y-axis direction) of the connector Cn. The middle part of the connector Cn may be greater than 20% of the entire width of the connector Cn and may be less than 40% of the entire width of the connector Cn.

When the second uneven portions CC2 having the relatively large size are positioned in the middle of the connector Cn as shown in FIG. 8, the middle of the connector Cn can reflect light at a height higher than the first uneven portion CC1. Hence, light reflected from the middle of the connector Cn may be smoothly reflected without the interruption of the first uneven portion CC1.

Figure 10:
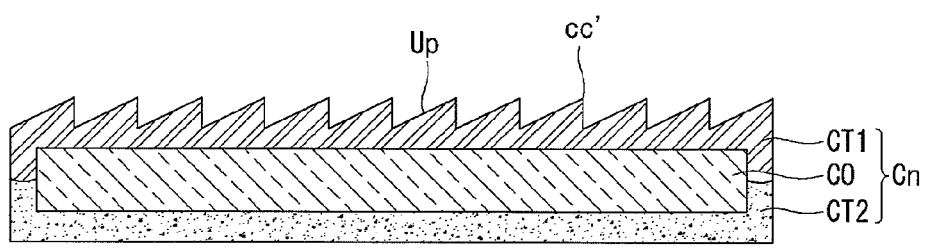
Figure 11:
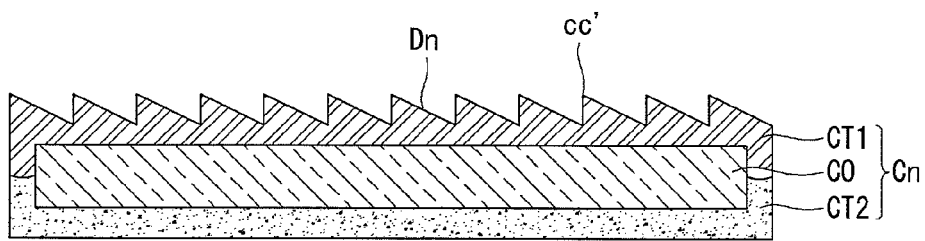

FIGS. 10 and 11 show an example where uneven portions include only rising inclined surfaces or only falling inclined surfaces. More specifically, FIG. 10 shows an example where uneven portions include only rising inclined surfaces Up, and FIG. 11 shows an example where uneven portions include only falling inclined surfaces Dn.

As described above, when the uneven portions include only the rising inclined surfaces or only the falling inclined surfaces, the connector Cn reflects light only in any one direction. Thus, as described above with reference to FIG. 1, the uneven portions of FIGS. 10 and 11 may be more advantageous in the second connector Cn2 positioned at one end of the string than the first connector Cn1 positioned between the solar cells. Namely, because the second connector Cn2 is positioned only at one end of the string, it may be preferable, but not required, that the uneven portions include only the rising inclined surfaces or only the falling inclined surfaces. Further, it may be preferable, but not required, that the first connector Cn1 includes both the rising inclined surfaces and the falling inclined surfaces.

The embodiment of the invention described that the connector Cn has the uneven portions. However, the bushing bar 13 may include the uneven portion having the rising inclined surfaces and the falling inclined surfaces or the uneven portion having the rising inclined surfaces or the falling inclined surfaces, in the same manner as the connector Cn.

For example, referring to FIG. 1, the upper bushing bar 13a may include the uneven portion having only the falling inclined surfaces, so as to reflect light to the inside of the solar cell module, and the lower bushing bar 13b may include the uneven portion having only the rising inclined surfaces.

It may be preferable, but not required, that the height of the connector Cn is greater than heights of the two adjacent solar cells. In this instance, the upper surface of the connector Cn, from which light is reflected, is positioned at a position higher than the solar cell. Hence, light reflected from the connector Cn may be well transmitted to the two adjacent solar cells.

Hereinafter, a solar cell module according to a second embodiment of the invention is described.

So far, the first embodiment of the invention described that the first line IC1 connected to the first solar cell C1 and the second line IC2 connected to the second solar cell C2 are positioned on different lines and are independently and individually formed, and the end of the first line IC1 and the end of the second line IC2, each of which overlaps the connector Cn, are separated from each other. On the contrary, the first line IC1 connected to the first solar cell C1 and the second line IC2 connected to the second solar cell C2 may be connected to each other and may be formed as one line. This is described in detail below.

Figure 12:
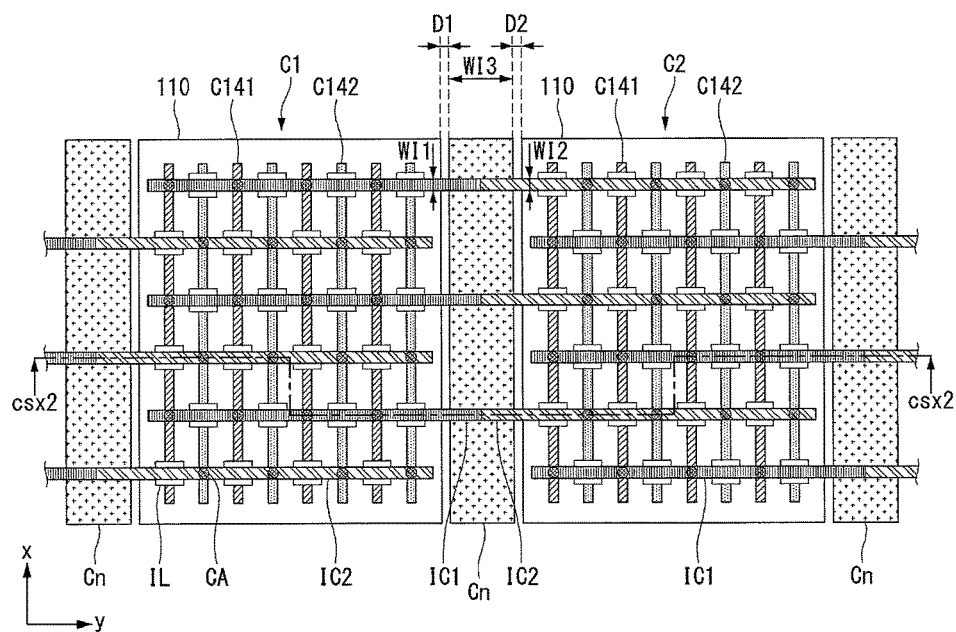
FIG. 12 shows a back plane of a solar cell module according to a second embodiment of the invention.
Figure 13:
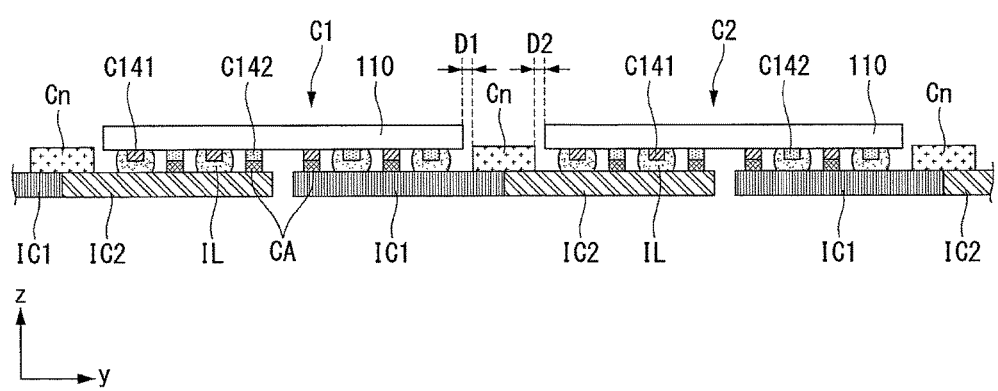
FIG. 13 is a cross-sectional view taken along line csx2-csx2 of FIG. 12.

FIGS. 12 and 13 illustrate the solar cell module according to the second embodiment of the invention. More specifically, FIG. 12 shows a back plane of the solar cell module according to the second embodiment of the invention, and FIG. 13 is a cross-sectional view taken along line csx2-csx2 of FIG. 12.

As shown in FIGS. 12 and 13, a first line IC1 connected to a first solar cell C1 and a second line IC2 connected to a second solar cell C2 may be connected to each other and may be formed as one line. Hence, an end of the first line IC1 and an end of the second line IC2, each of which overlaps the connector Cn, may not be separated from each other and may be connected to each other to form one body. Thus, the end of the first line IC1 and the end of the second line IC2 may be positioned on the same line.

Thus, each of the plurality of first lines IC1 connected to the first solar cell C1 and each of the plurality of second lines IC2 connected to the second solar cell C2 may be positioned on the same line.

As shown in FIGS. 12 and 13, the plurality of first lines IC1 connected to the first solar cell C1 may be connected to a plurality of first electrodes C141 using a conductive adhesive CA. Further, the plurality of second lines IC2 connected to the second solar cell C2 may be connected to a plurality of second electrodes C142 using the conductive adhesive CA.

So far, the first and second embodiments of the invention described that the connector Cn is positioned between the semiconductor substrates 110 of the solar cells and is separated from each semiconductor substrate 110 without the overlap therebetween, as an example. On the contrary, the connector Cn may be positioned between the semiconductor substrates 110 of the solar cells and may overlap some of the semiconductor substrates 110. This is described in detail below.

Figure 14:
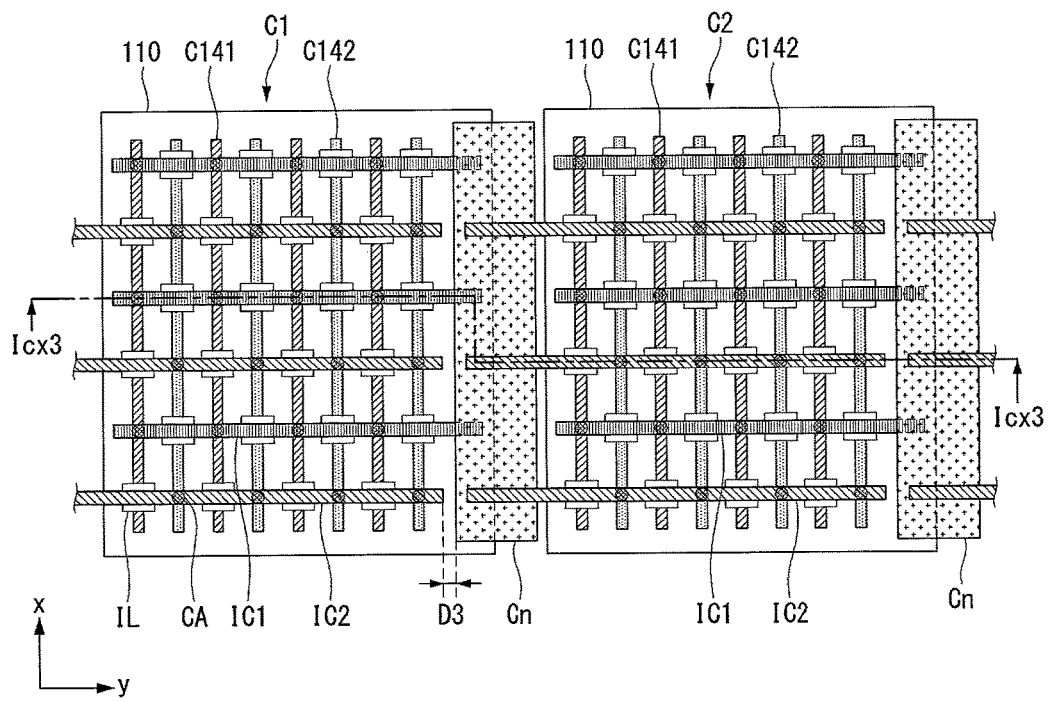
FIG. 14 shows a back plane of a solar cell module according to a third embodiment of the invention.
Figure 15:
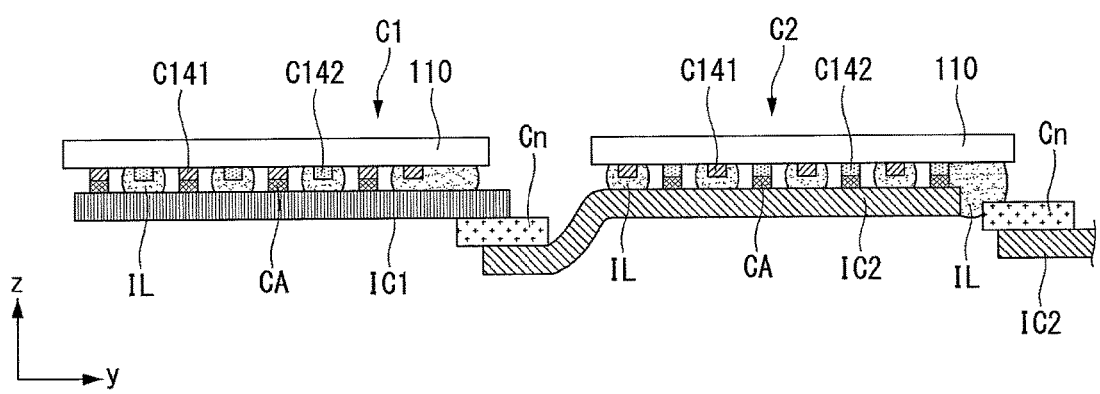
FIG. 15 is a cross-sectional view taken along line Icx3-Icx3 of FIG. 14.

FIGS. 14 and 15 illustrate a solar cell module according to a third embodiment of the invention. More specifically, FIG. 14 shows a back plane of the solar cell module according to the third embodiment of the invention, and FIG. 15 is a cross-sectional view taken along line Icx3-Icx3 of FIG. 14.

At least a portion of a connector Cn according to the third embodiment of the invention may partially overlap some of semiconductor substrates 110 included in a plurality of solar cells C1 and C2.

For example, as shown in FIGS. 14 and 15, a portion of the connector Cn may overlap the semiconductor substrate 110 of the first solar cell C1, and the connector Cn may be separated from the semiconductor substrate 110 of the second solar cell C2.

On the contrary, the entire area of the connector Cn may overlap the semiconductor substrate 110 of the first solar cell C1.

A plurality of first lines IC1 connected to the first solar cell C1 may be connected to a front surface of the connector Cn, and a plurality of second lines IC2 connected to the second solar cell C2 may be connected to a back surface of the connector Cn.

As shown in FIG. 15, an insulating layer IL for preventing unnecessary short circuit between the semiconductor substrate 110 of the first solar cell C1 and the connector Cn may be formed in a non-formation area of the first line IC1 among an overlap area between the semiconductor substrate 110 of the first solar cell C1 and the connector Cn.

FIGS. 14 and 15 show that the first lines IC1 connected to the first solar cell C1 extend to the outside of the semiconductor substrate 110 of the first solar cell C1, as an example. However, the first lines IC1 of the first solar cell C1 may not extend to the outside of the semiconductor substrate 110 of the first solar cell C1.

So far, the first to third embodiments of the invention described that the connector Cn is configured as one metal pad extending in the first direction x, as an example. However, the connector Cn may be in the plural. This is described in detail below.

Figure 16:
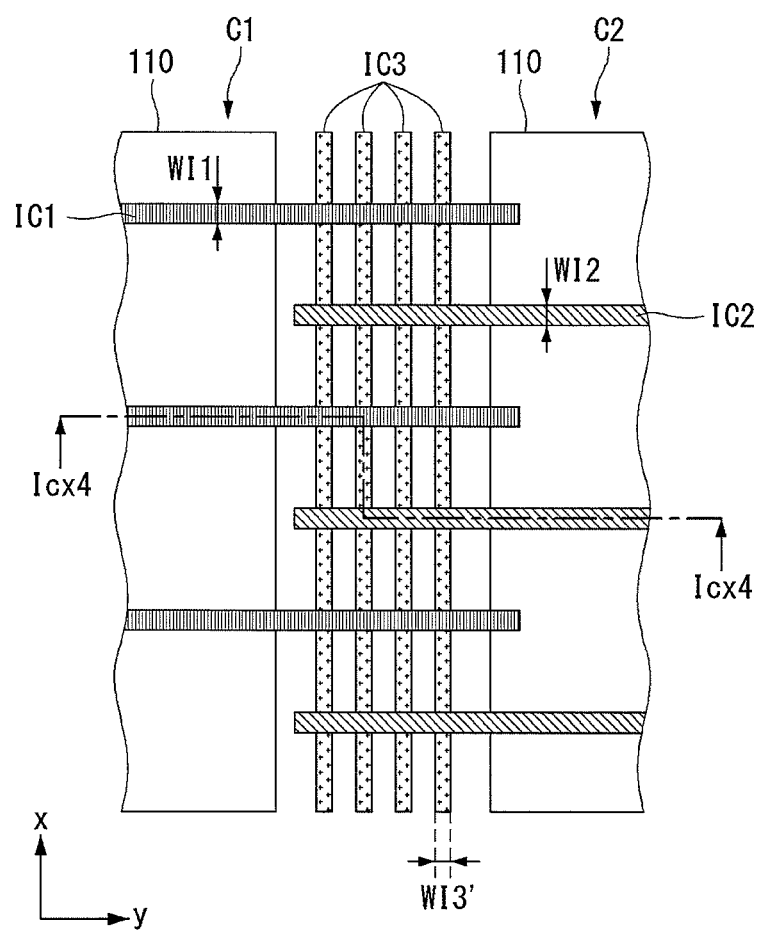
FIG. 16 shows a back plane of a solar cell module according to a fourth embodiment of the invention.
Figure 17:
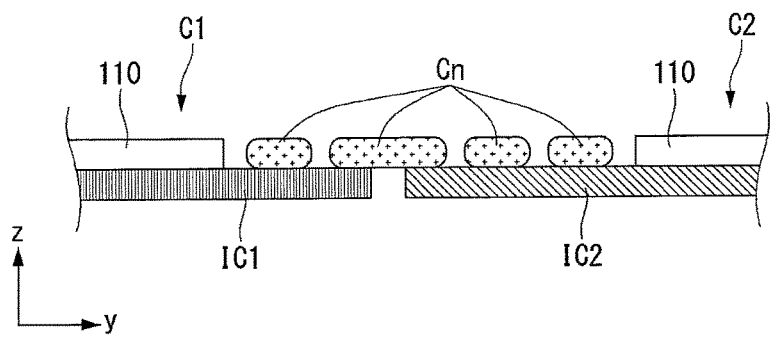
FIG. 17 is a cross-sectional view taken along line Icx4-Icx4 of FIG. 16.

FIGS. 16 and 17 illustrate a solar cell module according to a fourth embodiment of the invention. More specifically, FIG. 16 shows a back plane of the solar cell module according to the fourth embodiment of the invention, and FIG. 17 is a cross-sectional view taken along line Icx4-Icx4 of FIG. 16.

As shown in FIGS. 16 and 17, a plurality of connectors Cn may be separated from one another and may extend in the first direction x.

Even in this instance, light incident between solar cells may be again incident on the solar cells through the plurality of connectors Cn extending in the first direction x, and thus the efficiency of the solar cell module may be further improved.

Each of the plurality of connectors Cn may include a core CO, a first coating part CT1, and a second coating part CT2 in the same manner as the first embodiment.

In the fourth embodiment of the invention, a width WI3 of the connector Cn may be the same as widths WI1 and WI2 of first and second lines IC1 and IC2. However, the width WI3 or a thickness of the connector Cn may be greater than the widths WI1 and WI2 or thicknesses of the first and second lines IC1 and IC2, so as to secure a serial resistance between the solar cells.

Figure 18:
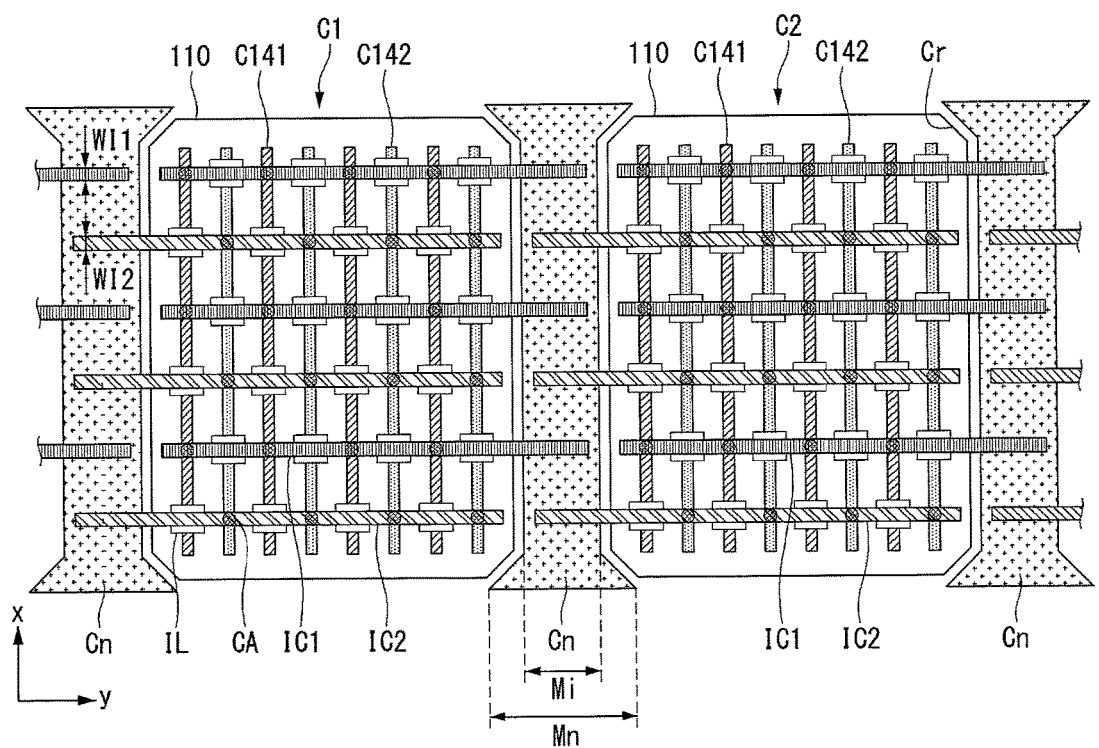
FIG. 18 illustrates a solar cell module according to a fifth embodiment of the invention.

FIG. 18 illustrates a solar cell module according to a fifth embodiment of the invention.

Solar cells C1 and C2 according to the fifth embodiment of the invention have the same configuration as the solar cells C1 and C2 according to the first embodiment of the invention shown in FIGS. 3 and 4, except that each of the solar cells C1 and C2 is a pseudo square type solar cell, in which a corner Cr of the solar cell is inclined. The corner of the pseudo square type solar cell is inclined unlike the solar cells according to the above-described embodiments of the invention. The pseudo square type solar cell is manufactured to have the inclined corner because of characteristics of a manufacturing process. In general, the corner forms the arc corresponding to a portion of a circle, and four corners of each solar cell have the same size.

Thus, when the pseudo square type solar cells constitute the solar cell module, a distance between the two adjacent solar cells C1 and C2 may be differently set depending on a position. More specifically, the distance between the two adjacent solar cells C1 and C2 gradually increases at the corner and is uniform in other area. Namely, the distance at the corner is greater than the distance in the other area.

In the fifth embodiment of the invention, a connector Cn has an I-shape, in which both ends of the connector Cn gradually widen toward the outside of the solar cell. Therefore, a distance between the first solar cell C1 and the connector Cn or a distance between the second solar cell C2 and the connector Cn may be uniform irrespective of the corners Cr of the solar cells C1 and C2.

In the fifth embodiment of the invention, a width and a thickness of the connector Cn are set to be the same as the above-described embodiments, and a length of the connector Cn is equal to or slightly greater than a width of the solar cell in the same direction as a longitudinal direction of the connector Cn. Preferably, the length of the connector Cn is equal to or greater than the width of the solar cell in consideration of a process margin and a distance between the connectors of adjacent strings in the longitudinal direction of the connector Cn. The maximum length of the connector Cn is 180 nm.

For example, when the solar cell module is configured using the solar cells each having the size of 156 (mm)*156 (mm), which is widely used in the current market, the maximum length of the connector Cn is 180 nm.

As described above, because the length of the connector Cn is greater than the width of the solar cell and also has the shape having the gradually increasing width at an edge, the connector Cn has the shape covering the corners Cr of the solar cells C1 and C2.

Thus, even when the solar cell has the inclined corner Cr, light reflected from the connector Cn may be incident on the adjacent solar cells C1 and C2 irrespective of the presence or the absence of the corner Cr of the solar cell.

It is preferable, but not required, that an edge width Mn of the connector Cn is greater than a middle width Mi of the connector Cn by 10 mm at most in consideration of the corner Cr of the solar cell.

Only the fifth embodiment of the invention described that the length of the connector Cn is greater than the width of the solar cell. However, the length of the connector Cn may be greater than the width of the solar cell irrespective of the presence or the absence of the corner Cr of the solar cell. Thus, in the above-described first to fourth embodiments of the invention, the length of the connector Cn may be greater than the width of the solar cell.

The first to fifth embodiments of the invention described using a back contact solar cell, in which both first electrodes C141 and second electrodes C142 are formed on a back surface of a substrate, as an example. However, the above-described embodiments of the invention may be equally applied to a solar cell having a conventional structure, in which first electrodes C141 and second electrodes C142 are respectively formed on a front surface and a back surface of a substrate. The following sixth embodiment of the invention will describe that the connector CN according to the above-described embodiments of the invention may be equally applied to the solar cell module including the solar cells having the conventional structure. The description of structures and components identical or equivalent to those illustrated in the first to fifth embodiments is not repeated in the sixth embodiment of the invention, and a difference therebetween is mainly described.

Figure 19:
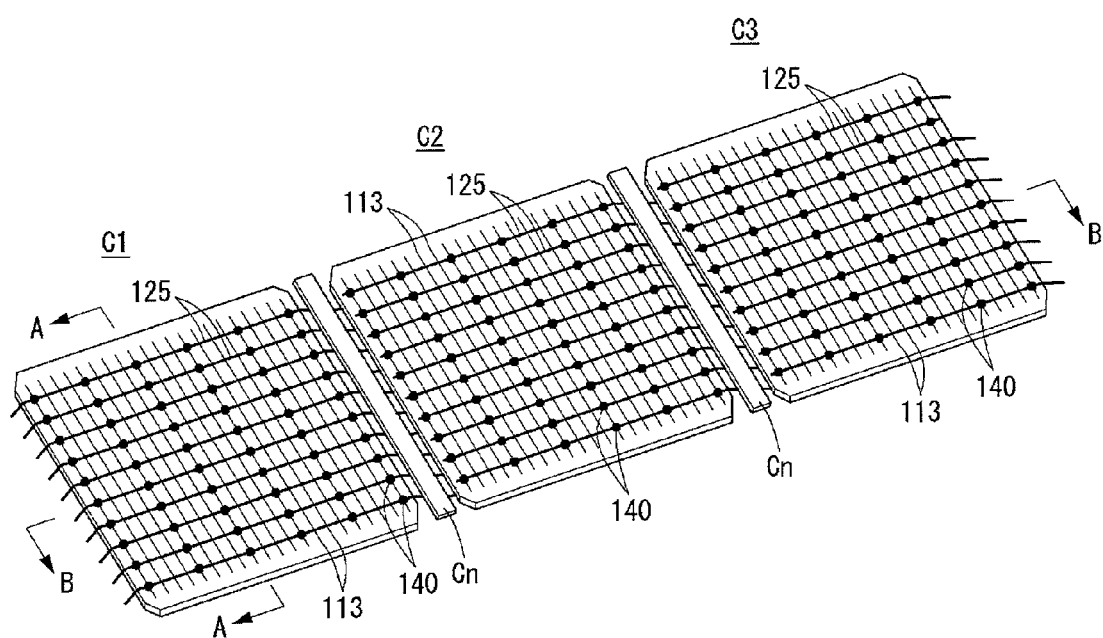
FIG. 19 shows a back plane of a solar cell module according to a sixth embodiment of the invention including a solar cell having a conventional structure.
Figure 20:
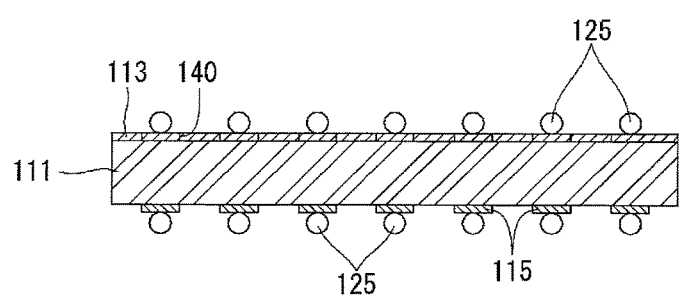
FIGS. 20 and 21 are cross-sectional views taken along lines A-A and B-B of FIG. 19.
Figure 21:
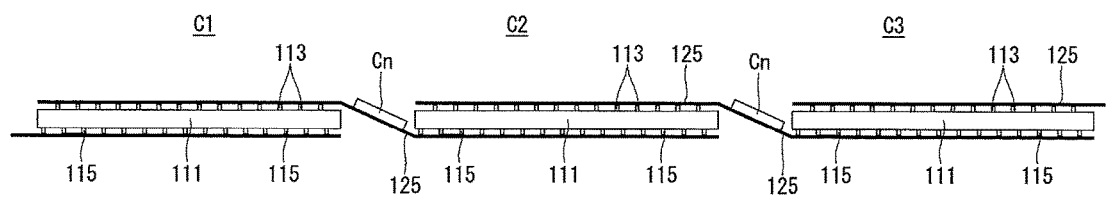

FIG. 19 is a plane view of a solar cell module according to a sixth embodiment of the invention including solar cells having a conventional structure, and FIGS. 20 and 21 are cross-sectional views taken along lines A-A and B-B of FIG. 19.

As shown in FIGS. 19 to 21, the solar cell module according to the sixth embodiment of the invention includes a plurality of solar cells C1, C2, and C3, a plurality of lines 125 connecting the two adjacent solar cells, and a connector Cn which is disposed between the two adjacent solar cells and is physically and electrically connected to the plurality of lines 125.

The solar cell module according to the sixth embodiment of the invention is different from the above-described embodiments of the invention in that first electrodes 113 formed on a front surface of one of the plurality of solar cells C1, C2, and C3 and second electrodes 115 formed on a back surface of other solar cell adjacent to the one solar cell are connected to each other through the plurality of lines 125.

The lines 125 are connected to first electrodes 113 formed on a front surface of the first solar cell C1 and are connected to second electrodes 115 formed on a back surface of the second solar cell C2 adjacent to the first solar cell C1.

The solar cell according to the sixth embodiment of the invention has a conventional structure, in which electrodes are positioned on each of a front surface and a back surface of a semiconductor substrate 111.

As shown in FIG. 20, the solar cell according to the sixth embodiment of the invention has a cube shape having a thin thickness. The first electrodes 113 are formed on the front surface of the solar cell, on which light is incident, and are connected to wiring members 125. The first electrodes 113 collect carriers of a conductive type opposite a conductive type of the semiconductor substrate 111. For example, if the semiconductor substrate 111 is a p-type semiconductor substrate, the first electrodes 113 collect electrons.

The first electrode 113 extends in a direction crossing a longitudinal direction of the wiring member 125. The first electrodes 113 are arranged in parallel with one another and thus entirely form a stripe arrangement.

The semiconductor substrate 111 forms a p-n junction. The semiconductor substrate 111 includes impurities of a first conductive type and forms a p-type semiconductor substrate or an n-type semiconductor substrate.

The second electrodes 115 are formed on the back surface of the semiconductor substrate 111 in a direction crossing the first electrodes 113. The second electrodes 115 collect carriers of the conductive type opposite the first electrodes 113.

For example, the second electrode 115 has an island shape, and a plurality of electrodes having the island shape are connected to the wiring members 125 in a longitudinal direction of the wiring member.

An emitter region and a back surface field region for reducing a potential barrier and a passivation layer for preventing a combination of carriers at the surface exist between the semiconductor substrate 111 and the first electrode 113 or the second electrode 115.

The solar cells having the above-described configuration are connected to each other through a plurality of lines 125. The lines 125 in the sixth embodiment of the invention have the same configuration as the above-described embodiments.

The plurality of lines 125 are used to connect the two adjacent solar cells. One side of the line 125 is connected to the first electrode 113 of the first solar cell C1, and the other side is connected to the second electrode 115 of the second solar cell C2. A soldering method using a melting and coupling process of a material is preferably used to connect the first and second electrodes 113 and 115 to the plurality of lines 125.

In the sixth embodiment of the invention, a pad 140 may be selectively formed at a crossing of the first electrode 113 and the line 125. The pad 140 increases a crossing area of the first electrode 113 and the line 125 and reduces a contact resistance when the line 125 is connected to the first electrode 113. Further, the pad 140 increases a connection strength between the first electrode 113 and the line 125.

One example of the soldering method disposes the plurality of lines 125 on each of the front surfaces and the back surfaces of the two adjacent solar cells, disposes the plurality of lines 125 to be opposite to the first and second electrodes 113 and 115, and heats coating parts of the plurality of lines 125 at a temperature equal to or higher than a melting temperature for several seconds in this state. Hence, while the coating parts are melted and cooled, the plurality of lines 125 are attached to the first and second electrodes 113 and 115.

In alternative example, the plurality of lines 125 may be attached using the above conductive adhesive CA.

The connector Cn is disposed between the first and second solar cells C1 and C2 and between the second and third solar cells C2 and C3 and thus connects the adjacent first and second solar cells C1 and C2 and the adjacent second and third solar cells C2 and C3.

As described above, the first and second solar cells C1 and C2 are connected through the lines 125 having the thin wire shape, and also the second and third solar cells C2 and C3 are connected through the lines 125 having the thin wire shape. In this instance, the lines 125 may be broken or thermally deformed by a mechanical impact.

However, in the sixth embodiment of the invention, because the connector Cn is connected to the lines 125, the above-described problem may be solved. Furthermore, because the connector Cn has the uneven portions, a heat generation amount of the solar cell may increase by increasing an amount of light incident on the adjacent solar cell.

In the sixth embodiment of the invention, it is preferable, but not required, that the lines 125 are attached to the back surface of the connector Cn. The lines 125 are attached to the connector Cn through the soldering method or the conductive adhesive CA.

Examples of wiring members each having a different thickness are described below with reference to FIGS. 22 to 30. In the following description, configuration of a solar cell module is the same as the solar cell module described above, and only the wiring members positioned in the solar cell are simply shown for the sake of brevity and ease of reading.

Figure 22:
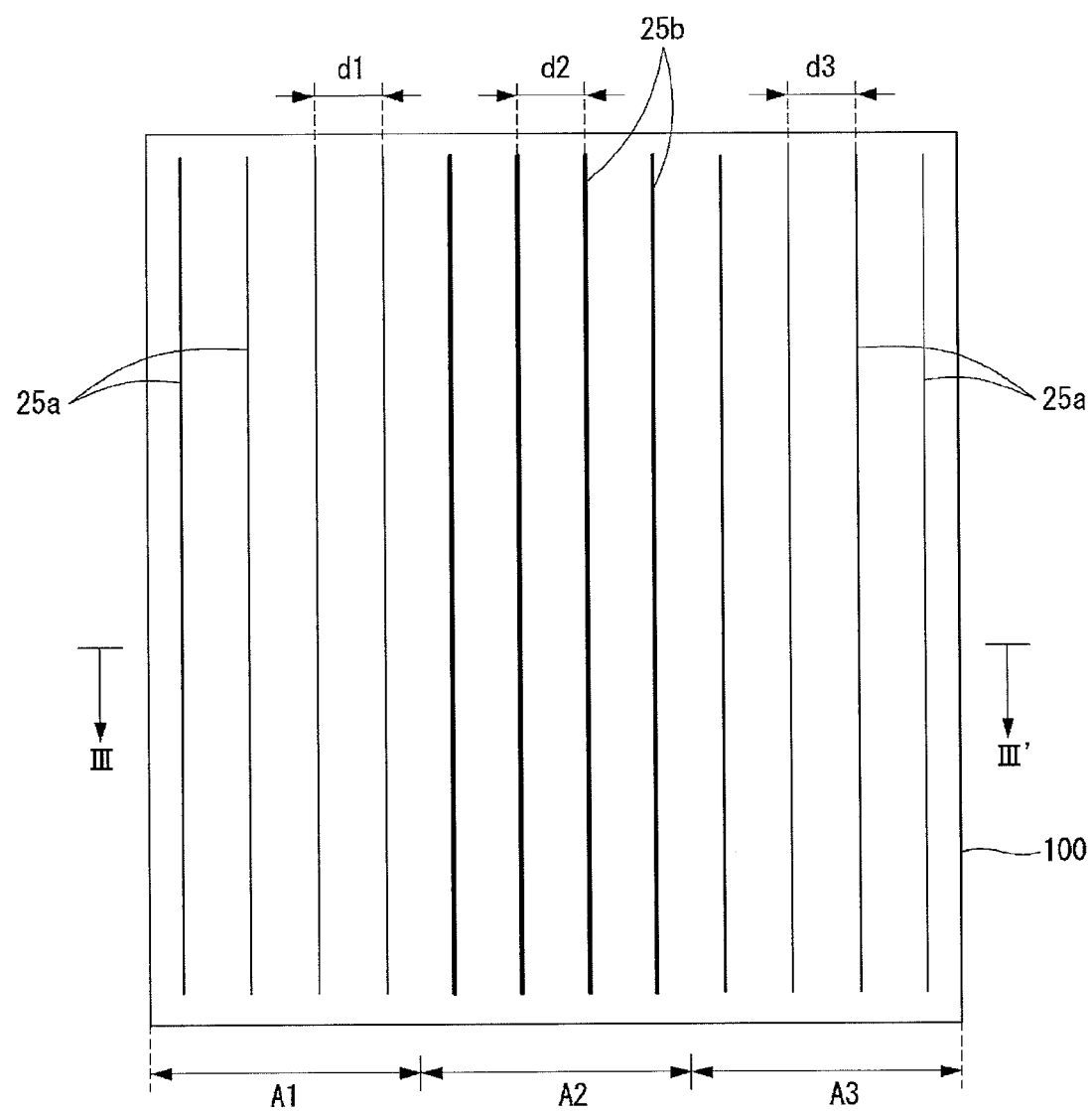
FIG. 22 shows that a solar cell is divided into three areas and thicknesses of wiring members of the three areas are different from one another.
Figure 23:
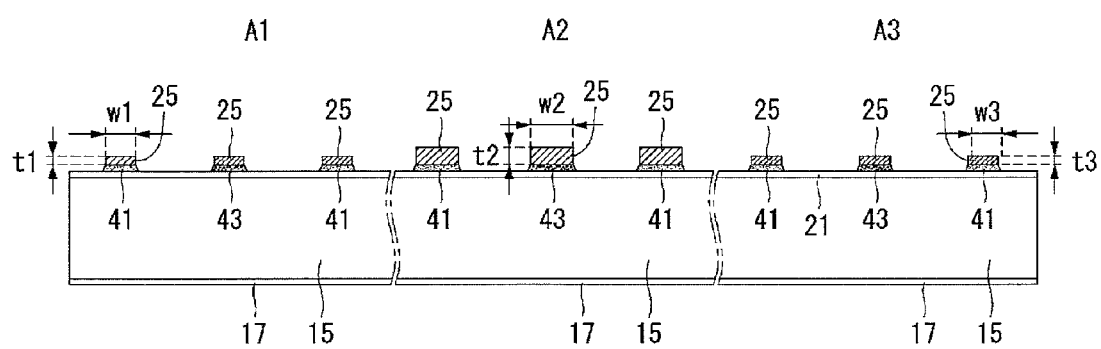
FIG. 23 is a cross-sectional view taken along line III-III' of FIG. 22.

FIG. 22 shows that a solar cell is divided into three areas and thicknesses of wiring members of the three areas are different from one another. FIG. 23 is a cross-sectional view taken along line III-III' of FIG. 22.

Wiring members 25 are disposed on a back surface of a solar cell 100 in parallel with one another and are connected to electrodes of the solar cell 100. The wiring members 25 have a stripe arrangement, and the wiring members 25 of each area are separated from one another at a regular distance therebetween. Thus, as shown in FIG. 22, electrode pitches d1, d2, and d3 are the same as one another in "A1", "A2", and "A3".

As shown in FIG. 22, "A1", "A2", and "A3" respectively indicate three areas obtained by dividing the solar cell 100 into three areas in a horizontal direction crossing a longitudinal direction of the wiring members 25. The second area A2 indicates a middle portion of a substrate of the solar cell 100, and the first area A1 and the third area A3 indicate left and right areas of the second area A2.

In the embodiment disclosed herein, the first to third areas A1 to A3 are divided from the solar cell based on a bending difference of the solar cell 100.

A stress generated through a thermal deformation of the wiring member 25 is transferred in the longitudinal direction of the wiring members 25 and bends the solar cell 100. A bending degree of the solar cell 100 may vary depending on a position due to several variables (for example, a thickness difference of the solar cell, a physical property difference of a formation material of the solar cell, etc.) including the stress transferred from the wiring member 25. A difference between the bending degrees of the solar cell 100 may be confirmed through the bending of the solar cell generated by attaching the wiring member under the same conditions irrespective of the areas of the solar cell 10 and performing a thermal process on the wiring member.

In the embodiment disclosed herein, a problem of the bending of the solar cell is reduced by reducing the stress difference.

In FIGS. 22 and 23, it is assumed that a stress of the second area A2 is less than stresses of the first area A1 and the third area A3, and the stresses of the first area A1 and the third area A3 are the same as each other.

In the embodiment disclosed herein, relatively thick wiring members 25b are disposed in the second area A2 having the relatively small stress, and relatively thin wiring members 25a are disposed in the first and third areas A1 and A3 having the relatively large stress.

As shown in FIGS. 22 and 23, the wiring member 25 having a rectangular cross section in the first area A1 has a first horizontal width w1 and a first vertical width t1, and the wiring member 25 having a rectangular cross section in the second area A2 has a second horizontal width w2 greater than the first horizontal width w1 and a second vertical width t2 greater than the first vertical width t1. Therefore, the size of the wiring member 25b of the second area A2 may be larger than the size of the size of the wiring member 25a of the first area A1.

Further, the wiring member 25 having a rectangular cross section in the third area A3 has a third horizontal width w3 less than the second horizontal width w2 and a third vertical width t3 less than the second vertical width t2.

In the embodiment of the invention, the relatively thick wiring members 25b are disposed in the second area A2 having the relatively small stress, and the relatively thin wiring members 25a are disposed in the first and third areas A1 and A3 having the relatively large stress. Hence, the stress in the second and third areas A2 and A3 may decrease by reducing the stress transferred in the longitudinal direction of the wiring members 25 in the second and third areas A2 and A3.

In other words, because the wiring member 25 contracts and expands in the longitudinal direction, the solar cell bends through the transfer of the stress resulting from the contraction and the expansion of the wiring member 25 in the longitudinal direction. The transfer of the stress may be more smoothly performed as a cross-sectional area of the wiring member 25 increases. However, in the embodiment of the invention, because the relatively thin wiring members are disposed in the first and third areas A1 and A3 having the relatively large stress, the transfer of the stress is not smoothly performed. As a result, a difference between the stresses of the first to third areas of the solar cell may decrease.

Figure 24:
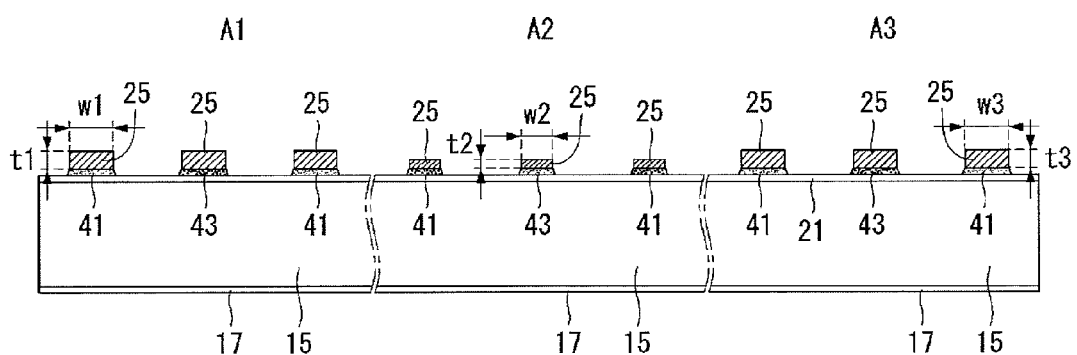
FIGS. 24 and 25 show wiring members disposed in the reverse of wiring members shown in FIG. 22.
Figure 25:
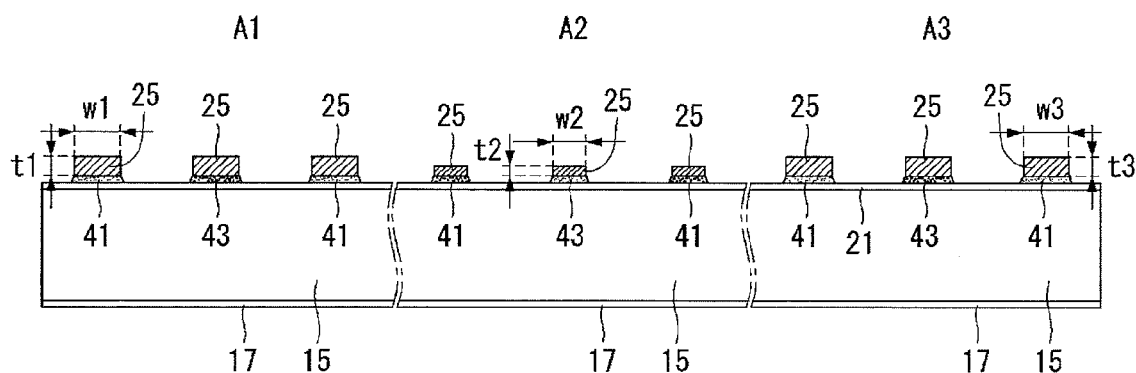

FIGS. 24 and 25 show wiring members disposed in the reverse of the wiring members shown in FIGS. 22 and 23. In FIGS. 24 and 25, a stress of the second area A2 is greater than stresses of the first and third areas A1 and A3, unlike FIGS. 22 and 23.

Because of this, relatively thin wiring members 25b are disposed in the second area A2 having the relatively large stress, and relatively thick wiring members 25a are disposed in the first and third areas A1 and A3 having the relatively small stress.

Figure 26:
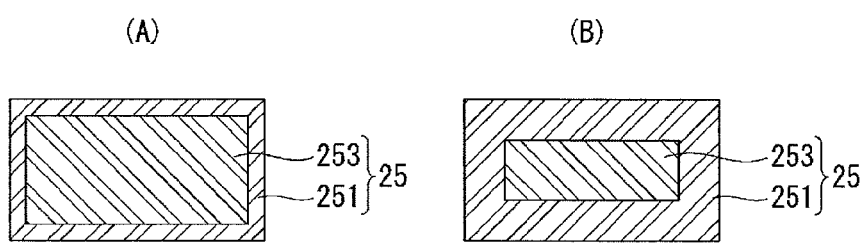
FIG. 26 shows a cross section of a wiring member and an example of a method for adjusting a thickness of a wiring member.

FIG. 26 shows a cross section of a wiring member and an example of a method for adjusting a thickness of a wiring member. As described above, the wiring member 25 includes a core layer 253 and a coating layer 251 surrounding the core layer 253.

Wiring members shown in (A) and (B) of FIG. 26 have the same vertical width and the same horizontal width and thus have the same cross-sectional area. However, the core layers 253 and the coating layers 251 of the wiring members are different from each other in the thickness. Namely, the wiring member shown in (A) of FIG. 26 has the core layer 253 thicker than the wiring member shown in (B) of FIG. 26 and has the coating layer 251 thinner than the wiring member shown in (B) of FIG. 26. Thus, an entire thickness of the wiring member shown in (A) of FIG. 26 is the same as an entire thickness of the wiring member shown in (B) of FIG. 26.

Similar to this, the thick wiring member 25b and the thin wiring member 25a each include the core layer 253 and the coating layer 251. Therefore, the thickness of the wiring member may be changed by changing the thickness of the core layer 253 or the coating layer 251.

So far, the embodiment of the invention described that the wiring members have the different thicknesses depending on the areas of the solar cell, and a distance between the wiring members having the different thicknesses is uniform in all of the areas of the solar cell.

On the contrary, the wiring members may have the same thickness in all of the areas of the solar cell, and a distance between the wiring members having the same thickness may not be uniform in the areas of the solar cell. Hence, a distribution of the wiring members, namely, the number of wiring members per unit area may be differently set in the areas of the solar cell.

Figure 27:
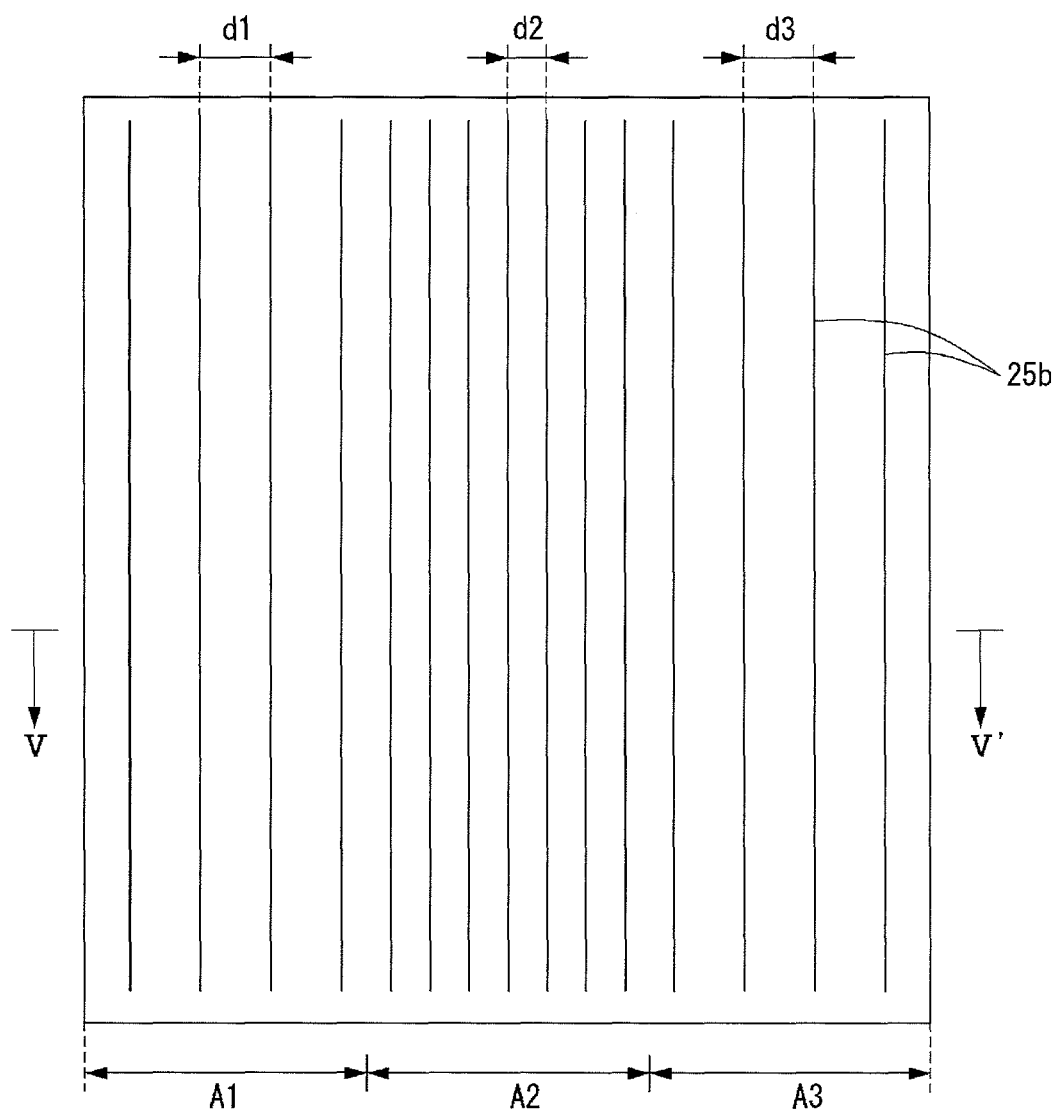
FIG. 27 shows that thicknesses of wiring members are the same in all of areas of a solar cell, and a distance between the wiring members is different depending on the areas.
Figure 28:
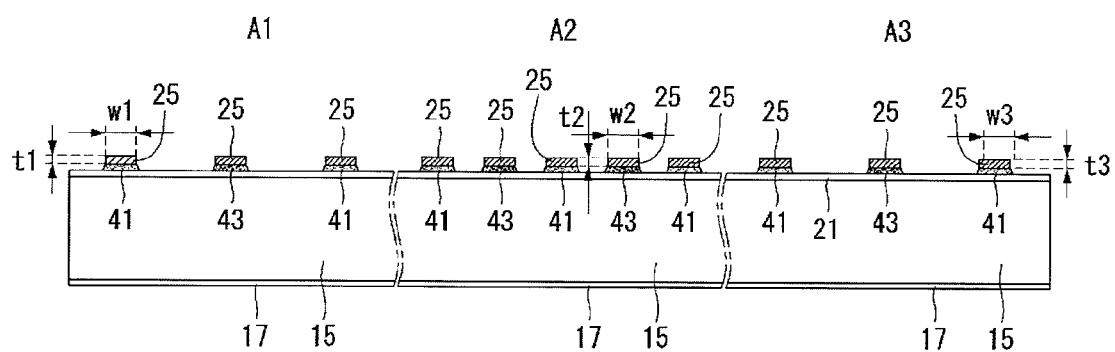
FIG. 28 is a cross-sectional view taken along line V-V' of FIG. 27.

FIG. 27 shows that thicknesses of wiring members are the same in all of the areas of the solar cell, and a distance between the wiring members is different depending on the areas. FIG. 28 is a cross-sectional view taken along line V-V' of FIG. 27.

In FIGS. 27 and 28, it is assumed that a stress of the second area A2 is less than stresses of the first area A1 and the third area A3, and the stresses of the first area A1 and the third area A3 are the same as each other.

The wiring member 25 in the first area A1 has a first horizontal width w1 and a first vertical width t1, and the wiring member 25 in the second area A2 has a second horizontal width w2 equal to the first horizontal width w1 and a second vertical width t2 equal to the first vertical width t1. Thus, the size of the wiring member 25 in the first area A1 is the same as the size of the wiring member 25 in the second area A2. Further, the wiring member 25 in the third area A3 has a third horizontal width w3 equal to the second horizontal width w2 and a third vertical width t3 equal to the second vertical width t2.

A distance between the wiring members 25 in the first area A1 is "d1", and a distance between the wiring members 25 in the second area A2 is "d2" less than "d1".

Thus, a distribution of the wiring members per unit area in the second area A2 is more than a distribution of the wiring members per unit area in the first area A1. Because the wiring members are less distributed in the first area A1 having the relatively large stress, the stress transferred to the wiring members of the first area A1 is less than the second area A2. As a result, a difference between the stresses of the areas of the solar cell may decrease, and the bending of the solar cell may decrease.

An amount of carriers generated in the middle of the solar cell is more than an amount of carriers generated in the perimeter of the solar cell. Namely, an amount of carriers collected in the second area A2 is more than an amount of carriers collected in the first area A1 or the third area A3. However, in FIGS. 27 and 28, because a relatively large number of wiring members are disposed in the second area A2, carriers collected through the electrodes of the solar cell may be transferred without a loss of the carriers.

So far, the embodiment of the invention described that the solar cell is divided into the areas, and the wiring members are properly disposed depending on the areas of the solar cell. However, the wiring members having the different sizes may be disposed irrespective of the areas of the solar cell. This is described below with reference to FIGS. 29 and 30.

Figure 29:
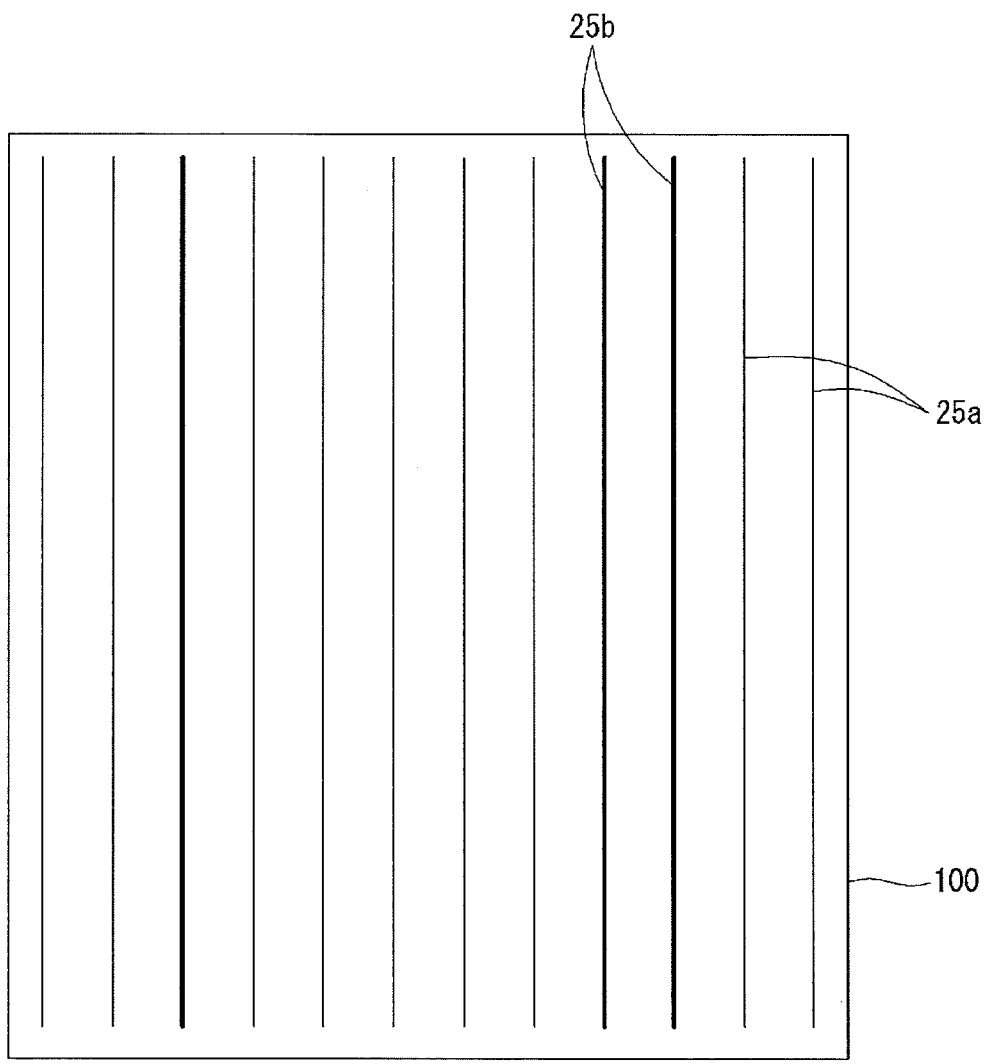
FIGS. 29 and 30 show wiring members each having a different size irrespective of areas of a solar cell.
Figure 30:
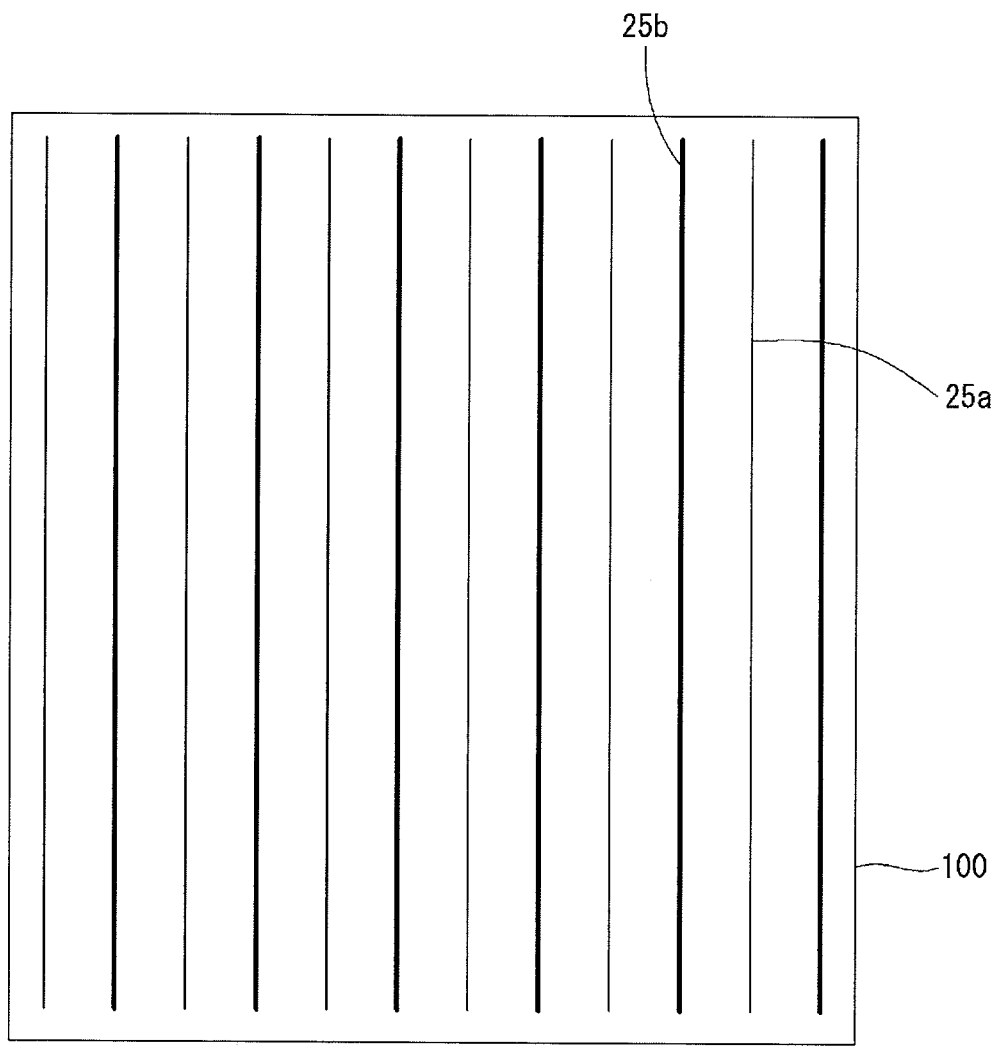

FIG. 29 shows that thin wiring members 25a and thick wiring members 25b are disposed without a regular pattern. FIG. 30 shows that thin wiring members 25a and thick wiring members 25b are alternately disposed.

Further, the thin wiring members 25a and the thick wiring members 25b may be disposed in accordance with the first and second electrodes of the solar cell.

As described above, the wiring member of one solar cell is connected to only one of the first and second electrodes of the one solar cell. For example, the thin wiring member 25a may be connected to one of the first and second electrodes of the solar cell, and the thick wiring member 25b may be connected to the other electrode (not connected to the thin wiring member 25a) of the first and second electrodes of the solar cell. In this instance, the thin wiring member 25a may correspond to one of the first wiring member 21 and the second wiring member 23, and the thick wiring member 25b may correspond to the other.

The solar cell includes the emitter region 121 and the back surface field region 172 as shown in FIG. 3. An area of the emitter region 121 and an area of the back surface field region 172 may be different from each other, so as to improve the electricity efficiency of the solar cell. In this instance, the first electrode C141 and the second electrode C142 formed at positions corresponding to the emitter region 121 and the back surface field region 172 may be configured depending on the different areas of the emitter region 121 and the back surface field region 172. Hence, thicknesses of the first electrode C141 and the second electrode C142 may be different from each other.

However, when the first electrode C141 and the second electrode C142 have the different thicknesses as described above, different stresses may be transferred to the solar cell through the first electrode C141 and the second electrode C142. Hence, the solar cell may bend. However, the bending of the solar cell may decrease by differently forming the thicknesses of the wiring members as described above.

The embodiment of the invention described that the wiring member is divided into the thin wiring member and the thick wiring member. However, the wiring member may be divided into two or more wiring members.

Further, the wiring member may have different thicknesses in the longitudinal direction of the wiring member.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
a plurality of solar cells each including a semiconductor substrate, and first electrodes and second electrodes which are formed on the semiconductor substrate and collect carriers of different conductive types, wherein the first electrodes and the second electrodes are extended in a first direction and alternatively disposed in the second direction crossing the first direction;
a plurality of first lines extended in the second direction to cross the first electrodes and the second electrodes, the plurality of first lines being connected to the first electrodes by a plurality of conductive adhesives formed at crossings of the first electrodes and the plurality of first lines and being insulated from the second electrodes by a plurality of insulating layers formed at crossings of the second electrodes and the plurality of first lines;
a plurality of second lines extended in the second direction to cross the first electrodes and the second electrodes, the plurality of second lines being connected to the second electrodes by the plurality of conductive adhesives formed at crossings of the second electrodes and the plurality of second lines and being insulated from the first electrodes by the plurality of insulating layers formed at crossings of the first electrodes and the plurality of second lines; and
a connector positioned between the first solar cell and the second solar cell and connected to the plurality of first lines and the plurality of second lines,
wherein a width of the connector is equal to or greater than at least one of a first distance between the first solar cell and the connector or a second distance between the second solar cell and the connector,
wherein an application area of the insulating layer on the connector is larger than an application area of the conductive adhesive on the connector, and
wherein ends of the plurality of first lines and the plurality of second lines of adjacent solar cells are bonded to the connector so that the adjacent solar cells are serially connected.

2. The solar cell module of claim 1, wherein an overlap area between the ends of the plurality of first lines and the plurality of second lines and the connector is equal to or less than the width of the connector.

3. The solar cell module of claim 2, wherein the overlap area between the ends of the plurality of first lines and the plurality of second lines and the connector is equal to or greater than the width of the connector*⅓.

4. The solar cell module of claim 2, wherein the connector includes a first surface, on which light is incident, and a second surface opposite the first surface, and
wherein the plurality of first lines and the plurality of second lines are connected to the second surface of the connector.

5. The solar cell module of claim 3, wherein a first surface of the connector includes a plurality of uneven portions each having a different inclined angle.

6. The solar cell module of claim 4, wherein the second surface of the connector includes the same material as at least one of materials forming the plurality of first lines and the plurality of second lines.

7. The solar cell module of claim 5, wherein a material forming the first surface of the connector is different from a material forming the second surface of the connector.

8. The solar cell module of claim 2, wherein a length of the connector is equal to or greater than a distance between two lines positioned on uppermost and lowermost sides among the plurality of first lines and the plurality of second lines and is less than a sum of a width of the first solar cell and a distance between strings of the plurality of solar cells.

9. The solar cell module of claim 8, wherein a middle width of the connector is less than an edge width of the connector.

10. The solar cell module of claim 9, wherein a maximum difference between the edge width of the connector and the middle width of the connector is 10 mm.

11. The solar cell module of claim 1, wherein the first electrodes and the second electrodes are formed on a back surface of the semiconductor substrate.

12. The solar cell module of claim 1, wherein the plurality of first lines and the plurality of second lines face each other on the connector at a distance which is equal to or less than the width of the connector.

13. The solar cell module of claim 2, further comprising:
a plurality of strings each having a column of the plurality of solar cells connected through the connector; and
a bushing bar configured to connect a first string and a second string, which are positioned adjacent to each other among the plurality of strings,
wherein a cross-sectional area of the connector is less than a cross-sectional area of the bushing bar.

14. The solar cell module of claim 13, wherein a forming material of the bushing bar, a forming material of the connector, and a forming material of the plurality of first lines and the plurality of second lines commonly include at least one material.

15. The solar cell module of claim 13, wherein the bushing bar includes a first surface, on which light is incident, and a second surface opposite the first surface,
wherein the plurality of first lines and the plurality of second lines connected to the bushing bar are connected to the second surface of the bushing bar, and
wherein the first surface of the bushing bar includes a plurality of uneven portions each having an inclined surface, which is inclined in one direction.

16. The solar cell module of claim 1, wherein the first distance between one of the adjacent solar cells and the connector and the second distance between the other of the adjacent solar cells and the connector are 50 μm to 3 mm.

17. The solar cell module of claim 16, wherein the width of the connector is 0.1 mm to 20 mm, and a thickness of the connector is 0.015 mm to 2 mm.

18. The solar cell module of claim 1, wherein a thickness of the connector is greater than a thickness of at least one of the adjacent solar cells.

19. The solar cell module of claim 1, wherein a thickness of the connector is equal to or less than a thickness of at least one of the plurality of first lines and the plurality of second lines.

20. The solar cell module of claim 1, wherein a cross-sectional area of the plurality of first lines is different from a cross-sectional area of the plurality of second lines.

21. The solar cell module of claim 20, wherein a cross-sectional area of the first electrode of one of the adjacent solar cells is smaller than a cross-sectional area of the first electrode of the other of the adjacent solar cells, and wherein the cross-sectional area of the plurality of first lines is larger than the cross-sectional area of the plurality of second lines.

* * * * *